United States Patent
Ishii et al.

(10) Patent No.: US 9,338,383 B2
(45) Date of Patent: May 10, 2016

(54) METHOD FOR DRIVING SOLID-STATE IMAGING DEVICE INCLUDING STARTING/ENDING A RESET OPERATION ON PIXELS ARRANGED IN A TWO-DIMENSIONAL ARRAY

(71) Applicant: Panasonic Corporation, Osaka (JP)

(72) Inventors: Motonori Ishii, Osaka (JP); Yoshihisa Kato, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 143 days.

(21) Appl. No.: 14/045,015

(22) Filed: Oct. 3, 2013

(65) Prior Publication Data

US 2014/0027619 A1    Jan. 30, 2014

Related U.S. Application Data

(63) Continuation of application No. PCT/JP2012/002150, filed on Mar. 28, 2012.

(30) Foreign Application Priority Data

Apr. 8, 2011    (JP) .................................. 2011-086842

(51) Int. Cl.

| | |
|---|---|
| H04N 5/378 | (2011.01) |
| H04N 5/359 | (2011.01) |
| H04N 5/376 | (2011.01) |
| H01L 27/146 | (2006.01) |

(52) U.S. Cl.
CPC ............. *H04N 5/378* (2013.01); *H04N 5/3597* (2013.01); *H04N 5/3765* (2013.01); *H01L 27/14609* (2013.01)

(58) Field of Classification Search
CPC ............ H01L 27/14609; H01L 5/3597; H01L 5/3765; H01L 5/378
See application file for complete search history.

(56) References Cited

U.S. PATENT DOCUMENTS 4,363,963 A    12/1982    Ando
7,906,752 B2    3/2011    Fukuoka et al.
(Continued)

FOREIGN PATENT DOCUMENTS

JP    58-50030    11/1983
JP    2000-253314    9/2000
(Continued)

OTHER PUBLICATIONS

International Search Report issued Jun. 12, 2012 in International (PCT) Application No. PCT/JP2012/002150.

*Primary Examiner* — Francis M Legasse, Jr.
(74) *Attorney, Agent, or Firm* — Wenderoth, Lind & Ponack, L.L.P.

(57) ABSTRACT

Provided is a method for driving a solid-state imaging device. The solid-state imaging device including pixels arranged in a two-dimensional array of m columns in a horizontal scanning direction and n rows in a vertical scanning direction (n is an integer no less than 2 and m is a natural number). The method including ending a reset operation on pixels in an i-th row among the pixels when (i) a reset operation on pixels in an (i+1)-th row among the pixels is in progress or (ii) time elapsed from when the reset operation on the pixels in the (i+1)-th row is ended is less than one-frame capturing time, where i is an integer no less than 1 and no greater than (n−1).

5 Claims, 19 Drawing Sheets

(56) References Cited

U.S. PATENT DOCUMENTS

| | | |
|---|---|---|
| 8,184,172 B2 | 5/2012 | Nakaseko |
| 8,390,036 B2 | 3/2013 | Goto |
| 2004/0036784 A1* | 2/2004 | Bock .................. 348/308 |
| 2006/0157760 A1* | 7/2006 | Hayashi et al. ........ 257/293 |
| 2009/0184238 A1 | 7/2009 | Fukuoka et al. |
| 2010/0171873 A1* | 7/2010 | Nakaseko ............... 348/362 |
| 2011/0049665 A1 | 3/2011 | Goto |

FOREIGN PATENT DOCUMENTS

| | | |
|---|---|---|
| JP | 2007-060350 | 3/2007 |
| JP | 2009-177378 | 8/2009 |
| JP | 4444371 | 3/2010 |
| JP | 2010-183558 | 8/2010 |

* cited by examiner

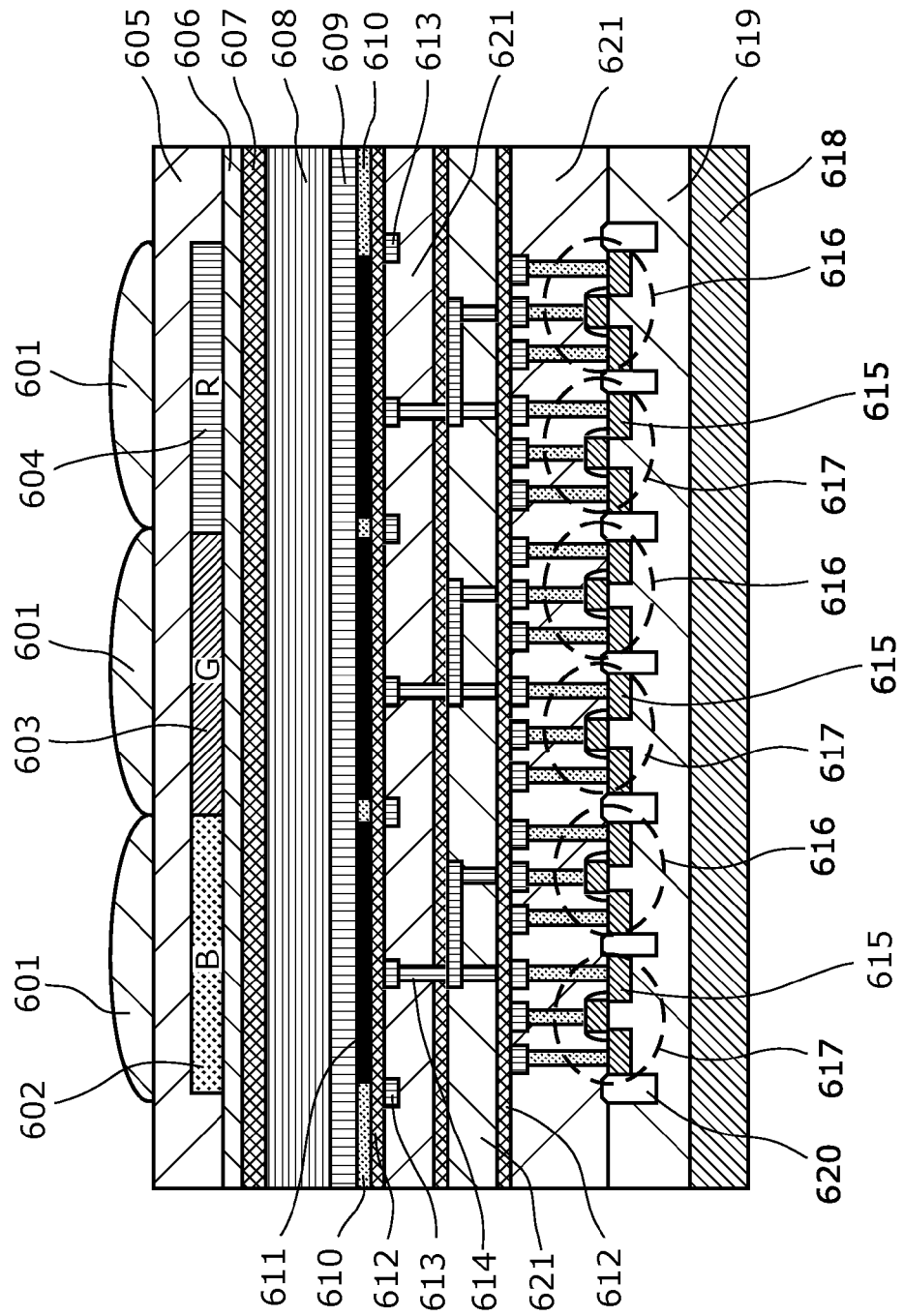

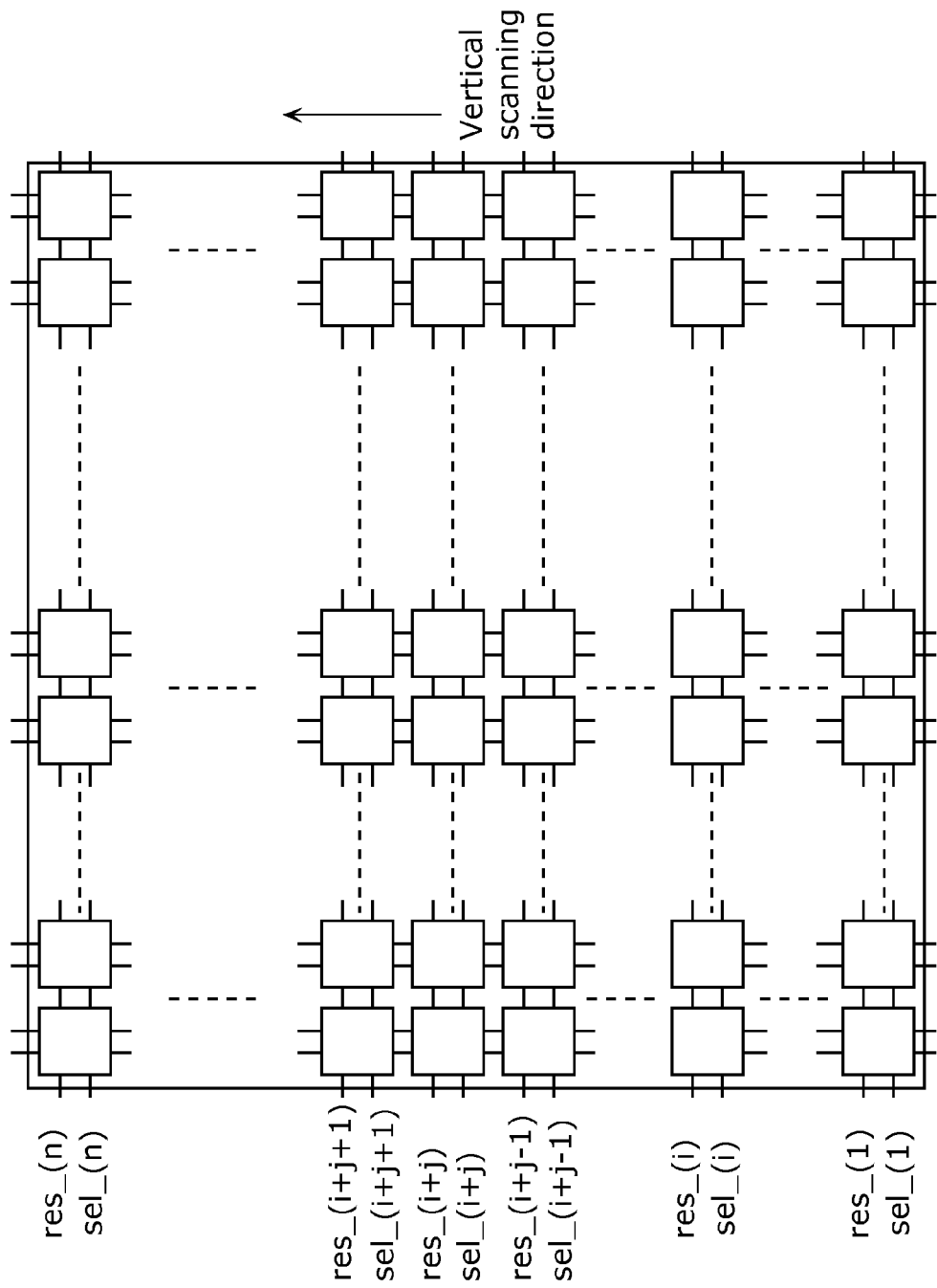

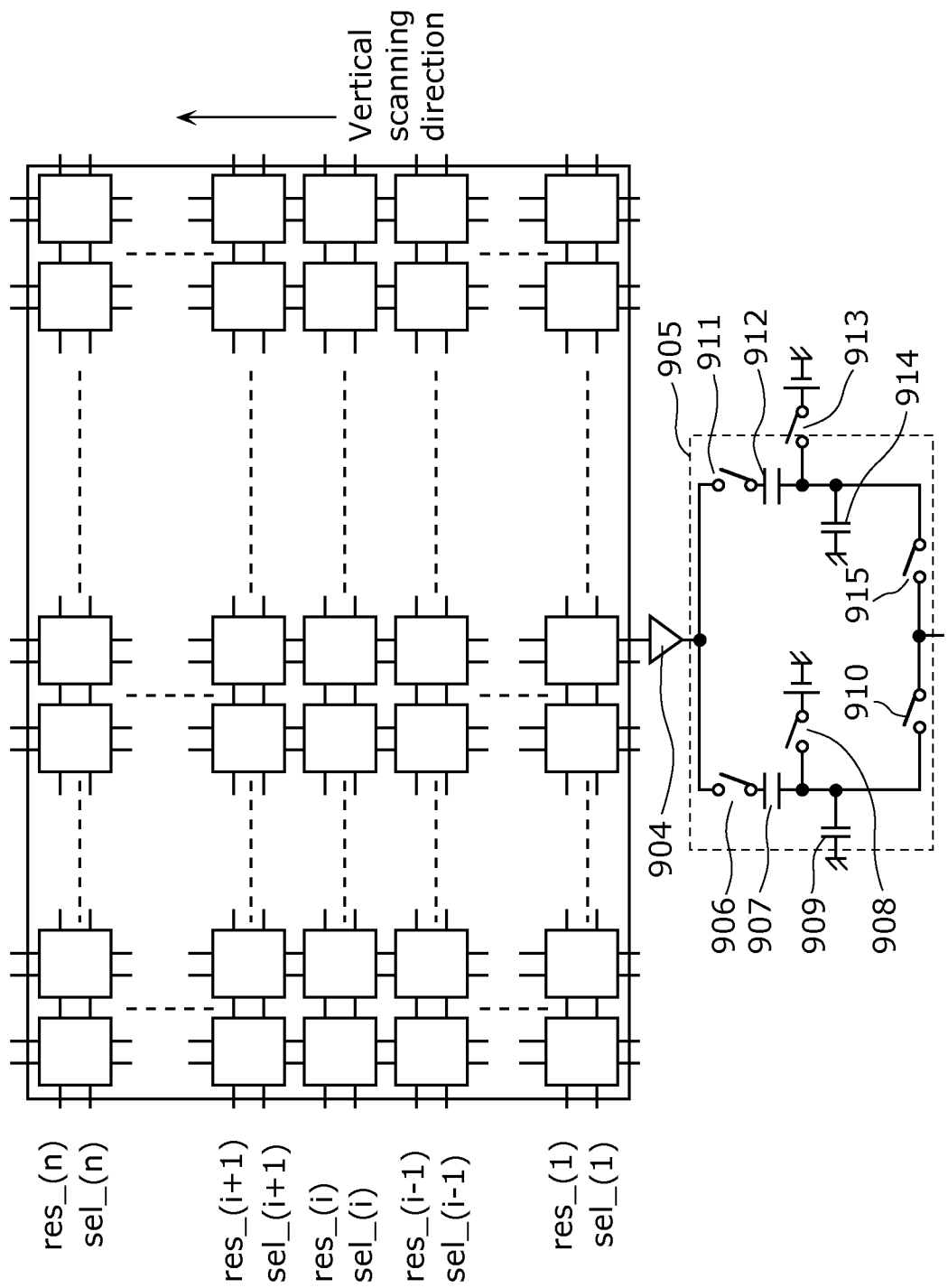

METHOD FOR DRIVING SOLID-STATE IMAGING DEVICE INCLUDING STARTING/ENDING A RESET OPERATION ON PIXELS ARRANGED IN A TWO-DIMENSIONAL ARRAY

CROSS REFERENCE TO RELATED APPLICATION

This is a continuation application of PCT International Application No. PCT/JP2012/002150 filed on Mar. 28, 2012, designating the United States of America, which is based on and claims priority of Japanese Patent Application No. 2011-086842 filed on Apr. 8, 2011. The entire disclosures of the above-identified applications, including the specifications, drawings and claims are incorporated herein by reference in their entirety.

FIELD

The present disclosure relates to a method for driving a solid-state imaging device for providing an image as an electrical signal.

BACKGROUND

Each of a complementary metal oxide semiconductor (CMOS) area image sensor and a metal oxide semiconductor (MOS) area image sensor (hereinafter, both referred to as the CMOS solid-state imaging device) and a charge coupled device (CCD) area image sensor (hereinafter, referred to as the CCD solid-state imaging device) generates an image signal by converting an input optical image into an electrical signal. These solid-state imaging devices are used as a functional element in various imaging apparatuses such as a digital still camera, a digital video camera, a network camera, and a mobile camera.

A conventional solid-state imaging device includes pixels arranged in a two-dimensional matrix and each having a photoelectric conversion unit (a photodiode) and a readout circuit unit, in a top surface of a semiconductor substrate. Accordingly, at a light-incoming surface, the area for the photoelectric conversion unit decreases by the area for the readout circuit unit. Thus, the conventional solid-state imaging device has a disadvantage that the aperture ratio decreases.

In order to solve this problem, Patent Literatures (PTL) 1 and 2 each discloses a layered solid-state imaging device having a photoelectric conversion unit including light absorbing materials stacked on a substrate and a readout circuit formed on the substrate.

For each of the pixels, the layered solid-state imaging device disclosed in these PTLs has the photoelectric conversion unit including a pixel electrode, a photoelectric conversion film stacked above the pixel electrode (on the light incoming side), and an opposite electrode formed on the upper surface of the photoelectric conversion film. The layered solid-state imaging device also brings out, from the photoelectric conversion unit via the pixel electrode, charges generated by the incident light, as a current signal. Usually, the layered solid-state imaging device has a charge blocking layer which conducts signal charges and blocks the opposite charges, to select positive or negative charges. This charge blocking layer is also formed opposite or on the pixel electrode.

FIG. 14 shows a schematic view of a circuit of a pixel unit (pixel) of a conventional layered solid-state imaging device which includes a photoelectric conversion film comprising an organic film, disclosed in PTL 1. The signal charges output from a photoelectric conversion unit 101 through a pixel electrode 102 are accumulated in a charge accumulation unit 103 which is a depletion layer capacity formed on the substrate. The charge accumulation unit 103 is connected to an input gate of a pixel readout transistor (amplifying transistor) 104 via a wire. A change in voltage caused by fluctuation in the amount of accumulated charges is detected by the readout transistor 104, and output, as a readout signal, to a vertical signal line 107 via a selection transistor 105 which selects timing to read out the pixel. Furthermore, a drain portion of the reset transistor 106 is connected to the charge accumulation unit 103 to reset the charges in the charge accumulation unit 103 after the signal charges are read out, and a charge accumulation unit voltage is set to an initial voltage upon resetting.

CITATION LIST

Patent Literature

[PTL 1] Japanese Patent No. 4444371
[PTL 2] Japanese Unexamined Patent Application Publication No. S58-50030

SUMMARY

Technical Problem

FIG. 15 shows a schematic view of the layered solid-state imaging device in which the pixels in FIG. 14 are arranged two-dimensionally, and pixels of n-rows (n is a natural number no less than 2) are arranged in a vertical scanning direction. Gates of reset transistors 106 in each row are controlled by a single reset control line provided for each row. Likewise, gates of selection transistors 105 are controlled by a selection control line. Each row is numbered from 1 to n in the vertical scanning direction, a reset control line of i-th row is represented as res_(i) and a selection control line is represented as sel_(i), where i is a natural number no less than 1 and no greater than (n−1), to describe a typical method for driving the layered solid-state imaging device when capturing video, with reference to FIG. 16.

FIG. 16 illustrates the typical driving method by showing a voltage applied to each control line and an output voltage which appears in a vertical signal line 107 of a column. FIG. 16 shows only (i−1)-th row to (i+1)-th row. Since those skilled in the art can easily understand that pixel signals for one screen can be obtained by performing the same driving sequentially on the 1st row to the n-th row, the description is omitted. Furthermore, the driving period (horizontal scanning period) for the i-th row is denoted as i-th scanning period.

In the (i−1)-th scanning period, first, sel_(i−1) is turned ON and the selection transistors 105 in pixels in the (i−1)-th row are turned ON. Thus, voltages V1 corresponding to the charges accumulated in the charge accumulation units 103 are generated by the pixel readout transistors 104 and provided to the vertical signal lines 107 (the voltages V1 are denoted as pixel signals). These are sampled by correlation double sampling (CSD) circuits or the like in the latter stage (hereinafter this operation is referred to as "readout of pixel signal"). Next, the reset operation on the (i−1)-th row is started. Specifically, res_(i−1) is turned ON and the charge accumulation units 103 are reset by the reset transistors 106 (a reset voltage is applied to the reset transistors 106 by a voltage supply or the like in advance). After that, the reset operation on the (i−1)-th row is ended by turning OFF res_(i−1), and voltages V2 (denoted as reset signals) provided to the vertical signal line 107 are sampled by the CDS circuit or the like (hereinafter this operation is referred to as "readout of reset signal"). Thus, differences between the above-described sampling voltages V1 and the voltages V2 are obtained as the output voltage of the CDS circuits. After that, the output voltage of the CDS circuits obtained in each column is sequentially output outside of the solid-state imaging device by the horizontal transfer circuit, and the driving of the (i−1)-th scanning period is ended. The same driving is performed in the i-th scanning period and the subsequent scanning periods. When the n-th scanning period is ended, the same driving is repeated from the 1st scanning period of the next frame. The output voltage V1 in the current frame is the voltage obtained by adding, to the output voltage V2 of the previous frame, the voltage corresponding to the intensity of the light irradiated to each pixel. Therefore, the voltages (V1-V2) obtained by the CDS circuits are the true image signal dependent only on the light intensity.

However, the Applicants of the present application found that such a driving method has a problem in that the image of the previous frame appears in the current frame, that is, motion blur is caused, particularly when capturing video in which the luminance changes significantly. The details are described below.

FIG. 17 shows two pixels each in the i-th row or the (i+1)-th row adjacent to each other in the vertical scanning direction. The configuration of each pixel is the same as in FIG. 14. However, in FIG. 17, the parasitic capacitance 108 between these pixels is added. The parasitic capacitance 108 occurs between the pixel electrodes 102, between the gate wires of the pixel readout transistors 104, and so on. A value of the charge accumulation unit (storage capacitor) 103 is represented as Ca (in general, this is a value common for all the pixels), and a value of the parasitic capacitance 108 is represented as Cp.

This parasitic capacitance 108 causes motion blur by the following mechanism.

In the i-th scanning period in FIG. 16, a voltage of a storage capacitor 103(i) after the reset operation on the i-th row is ended, that is immediately after the res_(i) is turned OFF, is represented as Vres(i). Furthermore, a voltage of the storage capacitor 103(i+1) at this time is represented as Vfd1(i+1). Vres1(i) is determined by a reset voltage applied to the reset transistor 106(i), a threshold of the reset transistor 106(i), a gate-drain capacitance (when the storage capacitor 103 is set to be a drain), and the like, and is not dependent on the intensity of the light irradiated to the pixel. In contrast, Vfd1(i+1) is dependent on the intensity of the light irradiated to the pixels in the (i+1)-th row.

Then, in the (i+1)-th scanning period, the voltage of the storage capacitor 103(i+1) after the reset operation on the (i+1)-th row is ended, that is immediately after the res_(i+1) is turned OFF, changes to Vres1(i+1). At this time, the storage capacitor 103(i) is not connected to any voltage source, that is floating, and therefore a change in the voltage of the storage capacitor 103(i+1) affects the voltage of the storage capacitor 103(i). Specifically, when the voltage of the storage capacitor 103(i) at this moment is represented as Vres2(i), Vres2(i) is represented by the following expression.

[Math 1]

$$Vres2(i) = Vres1(i) + \frac{Cp}{Ca+Cp}(Vres1(i+1) - Vfd1_{(i+1)}) \quad (1)$$

It is to be noted that charges accumulated through light irradiation since the end of the reset operation on the i-th row is not taken into consideration here. Furthermore, α is a value dependent on the parasitic capacitance of the selection transistor 105 and others, and is not dependent on the light irradiation amount.

After the above, light is irradiated to the pixels in the i-th row until the i-th scanning period of the next frame, and the charges are accumulated. The charges are represented as Qa.

In the i-th scanning period of the next frame, the voltages of the storage capacitors 103(i) when the selection transistor 105(i) are turned ON are approximately equal to the value obtained by adding the above Qa and Vres2(i). Therefore, when the voltage value is represented as Vout(i), Vout(i) is represented by the following expression.

[Math 2]

$$Vout(i) = Vres1(i) + \frac{Cp}{Ca+Cp}(Vres1(i+1) - Vfd1_{(i+1)}) + \frac{Qa}{Ca} \quad (2)$$

Specifically, Vout(i) is dependent on Vfd1(i+1), and this appears as the motion blur. For example, when the intensity of the light irradiated to the (i+1)-th row in the previous frame is high, the value of Vout(i) decreases depending on the light intensity. As the image, the image of the previous frame, with black and white reversed, is superimposed on the current frame. It is to be noted that β is a value depending on the parasitic element, in the same manner as α.

A non-limiting and exemplary embodiment provides a method for driving a solid-state imaging device which allows capturing of high-quality image with no motion blur, even when capturing video with a significant luminance change.

SOLUTION TO PROBLEM

A method for driving a solid-state imaging device according to an aspect of the present disclosure is a method for driving a solid-state imaging device including pixels arranged in a two-dimensional array of m columns in a horizontal scanning direction and n rows in a vertical scanning direction, where n is an integer no less than 2 and m is a natural number, the method including ending a reset operation on pixels in an i-th row among the pixels when a reset operation on pixels in an (i+1)-th row among the pixels is in progress, or time elapsed from when the reset operation on the pixels in the (i+1)-th row is ended is less than one-frame capturing time, where i is an integer no less than 1 and no greater than (n−1). With such a driving method, after ending the reset operation on a predetermined row, potential fluctuation of the output signal caused by coupling due to the reset operation on the adjacent row is not caused. Accordingly, no motion blur is caused between frames.

For example, a method for driving a solid-state imaging device according to an aspect of the present disclosure may further include: driving an electronic shutter which provides an accumulation time period of j horizontal scanning periods, where j is an integer no less than 1 and no greater than (n−1); and starting a reset operation on pixels in an (i+j+1)-th row among the pixels before ending a reset operation on the pixels in the (i+j)-th row, in a scanning period during which pixel signals are read out from the pixels in the i-th row. After ending the reset operation on the readout row, potential fluctuation of the output signal caused by coupling due to the reset operation on the adjacent row is not caused. Accordingly, no motion blur is caused between the frames.

For example, a method for driving a solid-state imaging device according to an aspect of the present disclosure may include in the following order: reading out pixel signals in the (i+1)-th row, starting the reset operation on the (i+1)-th row, and ending the reset operation on the i-th row, where i is an integer no less than 1 and no greater than (n−1). With such a driving method, potential fluctuation of the output signal caused by coupling due to the reset operation on the adjacent row can be removed by the second reset operation. Accordingly, no motion blur is caused between the frames.

For example, a method for driving a solid-state imaging device according to an aspect of the present disclosure may include in the following order: reading out pixel signals in the (i+1)-th row, starting the reset operation on the (i+1)-th row, ending the reset operation on the (i+1)-th row, reading out reset signals of the (i+1)-th row, and ending the reset operation on the i-th row, where i is an integer no less than 1 and no greater than (n−1). With such a driving method, potential fluctuation of the output signal caused by coupling due to the reset operation on the adjacent row can be removed by the second reset operation. Accordingly, no motion blur is caused between the frames.

For example, a method for driving a solid-state imaging device according to an aspect of the present disclosure may include in the following order: reading out the pixel signals in the (i+1)-th row, starting the reset operation on the (i+1)-th row, ending the reset operation on the i-th row, and reading out reset signals of the i-th row, where i is an integer no less than 1 and no greater than (n−1). With such a driving method, potential fluctuation of the output signal caused by coupling due to the reset operation on the adjacent row can be removed by the second reset operation. Accordingly, no motion blur is caused between the frames.

For example, a method for driving a solid-state imaging device according to an aspect of the present disclosure is a method for driving a solid-state imaging device, the solid-state imaging device including the pixels arranged in a two-dimensional array of m columns in the horizontal scanning direction and 2k rows or (2k+1) rows in the vertical scanning direction, where 2k is equal to n or(2k+1) is equal to n, the method including: driving odd-numbered frames including in the following order: reading out pixel signals in a (2a+1)-th row, resetting the (2a+1)-th row, reading out reset signals of the (2a+1)-th row, and resetting a 2a-th row, where a is an integer no less than 0 and no greater than k; and driving even-numbered frames including in the following order: reading out pixel signals in a (2a+2)-th row, resetting the (2a+2)-th row, reading out reset signals of the (2a+2)-th row, and resetting the (2a+1)-th row. With such a driving method, after ending the reset operation on a predetermined row, potential fluctuation of the output signal caused by coupling due to the reset operation on the adjacent row is not caused. Accordingly, no motion blur is caused between frames.

Advantageous Effects

With the present disclosure, a method for driving a solid-state imaging device which allows, even when capturing video with a significant luminance change, capturing high-quality image with no motion blur, by removing output fluctuation caused by coupling due to the reset operation on the adjacent row after readout of a row.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 2 shows a sectional view of the solid-state imaging device according to Embodiment 1 of the present disclosure.

FIG. 4 illustrates a solid-state imaging device according to Embodiment 2 of the present disclosure.

FIG. 7 illustrates a solid-state imaging device according to Embodiment 4 of the present disclosure.

DESCRIPTION OF EMBODIMENTS

Hereinafter, the exemplary embodiments of a method for driving a solid-state imaging device according to the present disclosure are described with reference to the accompanying Drawings. It should be noted that the present disclosure is described with reference to the following embodiments and the accompanying Drawings, which are for illustrative purposes only, and therefore the present disclosure is not limited to these embodiments. The numerical values, shapes, materials, constituent elements, the arrangement and connection of the constituent elements, steps, the processing order of the steps etc. shown in the following embodiments are mere examples, and thus do not limit the present disclosure. Furthermore, among the constituent elements in the following embodiments, constituent elements not recited in any of the independent claims indicating the most generic concept of the present disclosure are described as optional constituent elements for a more preferable embodiment.

[Embodiment 1]

The method for driving the solid-state imaging device according to Embodiment 1 of the present disclosure is described with reference to FIG. 1 to FIG. 3B.

Figure 1:
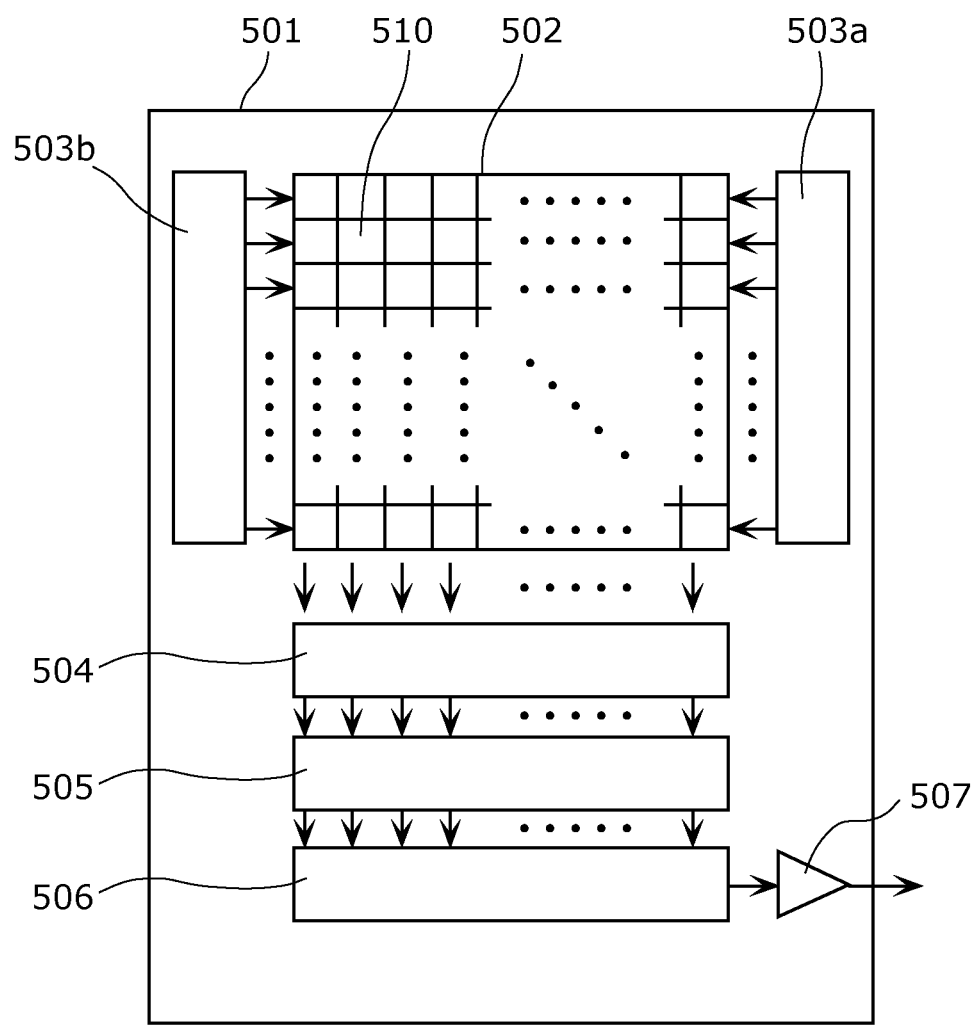
FIG. 1 illustrates each unit of a layered solid-state imaging device according to Embodiment 1 of the present disclosure.

First, an overall configuration of the solid-state imaging device according to Embodiment 1 of the present disclosure is described. FIG. 1 illustrates a block diagram showing a configuration of a solid-state imaging device 501 according to Embodiment 1 of the present disclosure.

This solid-state imaging device 501 includes a pixel array 502, row-signal driver circuits 503a and 503b, a column amplifier circuit 504 provided for each column, a noise cancelling circuit 505 provided for each column, a horizontal driver circuit 506, and an output stage amplifier 507.

FIG. 2 illustrates a cross-sectional view of regions for three pixels in the solid-state imaging device 501. It should be noted that 10 million pixels are arranged in the actual pixel array 502 for example. A circuit diagram of each pixel is the same as in FIG. 15.

As shown in FIG. 2, the solid-state imaging device 501 includes microlenses 601, a red color filter 602, a green color filter 603, a blue color filter 604, a protective film 605, a flattened film 606, an upper electrode 607 (second electrode), a photoelectric conversion film 608, an electron blocking layer 609, an inter-electrode insulating film 610, lower electrodes (first electrodes) 611, an inter-wire insulating film 612, a potential supply layer 613, a wiring layer 614, a substrate 618, a well 619, a shallow trench isolation region (STI region) 620, and an interlayer insulating layer 621.

The substrate 618 is a semiconductor substrate, for example, a silicon substrate. In the substrate 618, a signal readout circuit is formed for reading out, from the pixel, the signal charges generated through photoelectric conversion by the photoelectric conversion film 608 as a signal voltage (readout signal). Specifically, a plurality of transistors (an amplifying transistor 616, a selection transistor, and a reset transistor 617) is formed.

In order to efficiently collect incident light, the microlens 601 is formed on the top surface of the solid-state imaging device 501 for each pixel 510.

The red color filter 602, the green color filter 603 and the blue color filter 604 are formed to capture a color image. Each of the red color filter 602, the green color filter 603 and the blue color filter 604 is formed immediately below a corresponding one of the microlenses 601 and in the protective film 605. These optical elements are formed on the flattened film 606 to allow the microlenses 601 and the color filters to collect light uniformly and be colored uniformly over the 10 million pixels, respectively. The flattened film 606 comprises SiN for example.

The upper electrode 607 is formed below the flattened film 606 over the entire pixel array 502. The upper electrode 607 is transmissive to visible light. For example, the upper electrode 607 comprises an indium tin oxide (ITO).

The photoelectric conversion film 608 converts light into the signal charges. Specifically, the photoelectric conversion film 608 is formed below the upper electrode 607 and comprises organic molecules highly capable of absorbing light. The photoelectric conversion film 608 has a thickness of 500 nm for example. The photoelectric conversion film 608 is formed by a vacuum deposition process. The organic molecules are highly capable of absorbing light throughout the entire visible spectrum ranging from 400 nm to 700 nm.

The electron blocking layer 609 is formed below the photoelectric conversion film 608 and prevents electronic injection from the lower electrodes 611 while conducting the holes generated by converting incoming photons. This electron blocking layer 609 is formed on the inter-electrode insulating film 610 having a high flatness and the lower electrode 611.

The lower electrodes 611 are arranged in a matrix above the substrate 618. The lower electrodes 611 are electrically isolated with each other. Specifically, the lower electrodes 611 are formed between the inter-electrode insulating films 610 and collect the holes generated in the photoelectric conversion film 608. The lower electrodes 611 comprise TIN for example. The lower electrodes 611 are formed on the flattened inter-wire insulating film 612 having a thickness of 100 nm.

The lower electrodes 611 are isolated with each other at 0.2-μm intervals. Furthermore, the inter-electrode insulating film 610 is embedded in this isolation region too.

The potential supply layer 613 is provided below this isolation region and under the inter-wire insulating film 612. This potential supply layer 613 comprises Cu for example. Specifically, the potential supply layer 613 is formed below a space between adjacent ones of the lower electrodes 611 and between the adjacent lower electrodes 611 and the substrate 618. The potential supply layer 613 is also able to be set at an electrical potential independent of the adjacent lower electrodes 611. Specifically, the electrical potential for excluding the signal charges is provided to the potential supply layer 613 when the photoelectric conversion film 608 converts the light into the signal charges and when the signal readout circuit generates the readout signal. For example, a positive voltage is applied when the signal charges are holes. This can prevent the holes from being mixed into each pixel from the adjacent pixel. It should be noted that such an application of the voltage is controlled by a control unit (not shown) included in the solid-state imaging device 501 for example.

The wiring layer 614 is connected to the potential supply layer 613. The wiring layer 614 is connected to the FD unit (charge accumulation unit) 615 of the signal readout circuit and a gate terminal of the amplification transistor 616. The FD unit 615 is electrically connected to a source terminal of the reset transistor 617. The source terminal of the reset transistor 617 and the FD unit 615 share a diffusion region. These transistors, the selection transistor (not shown) formed in the same pixel, and the FD unit 615, are all formed in the same P-type well 619. This well 619 is formed on the substrate 618. In other words, the signal readout circuit is formed on the substrate 618 and generates the readout signal corresponding to the signal charges by detecting an amount of current or voltage change at each of the lower electrodes 611. The amplification transistor 616 generates the readout signal by amplifying the current or voltage change at each lower electrode 611.

Each transistor is electrically isolated by the STI region 620 comprising $SiO_2$.

A gate terminal of the reset transistor 617 is connected to the reset control line, and ON/OFF of the reset transistor 617 is controlled by the potential of the reset control line. For example, (i) when the potential of the reset control line is set to high-level and the reset control line is turned ON, the reset transistor 617 is turned ON and (ii) when the potential of the reset control line is set to low-level and the reset control line is turned OFF, the reset transistor 617 is turned OFF.

A gate terminal of the selection transistor is connected to the selection control line, and ON/OFF of the selection transistor is controlled by the potential of the selection control line. For example, (i) when the potential of the selection control line is set to high-level and the selection control line is turned ON, the selection transistor is turned ON and (ii) when the potential of the selection control line is set to low-level and the selection control line is turned OFF, the selection transistor is turned OFF. The configuration of the pixel array 502 in the present embodiment is the same as in FIG. 16. The pixel array 502 includes pixels arranged in n rows (n is an integer no less than 2) in a vertical scanning direction and m columns (m is a natural number) in a horizontal scanning direction.

Figure 3A:
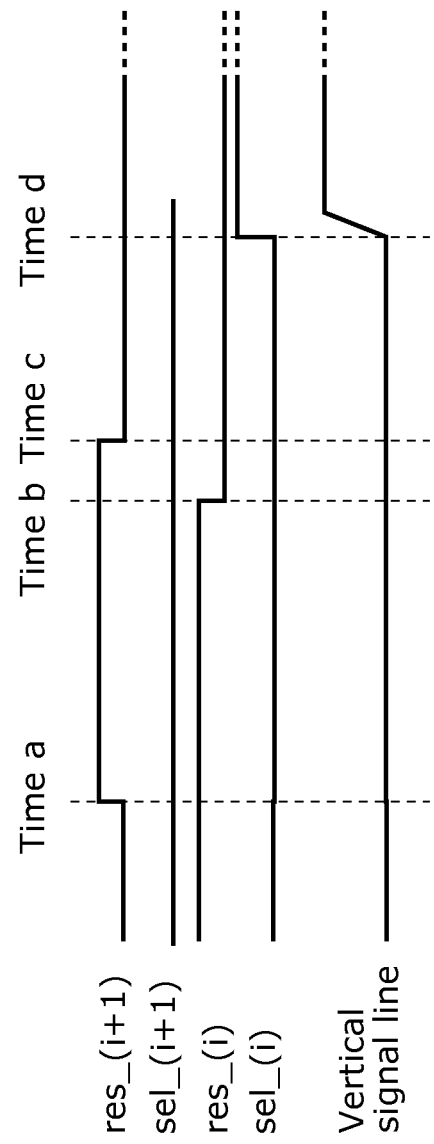
FIG. 3A illustrates a method for driving the solid-state imaging device according to Embodiment 1 of the present disclosure.
Figure 3B:
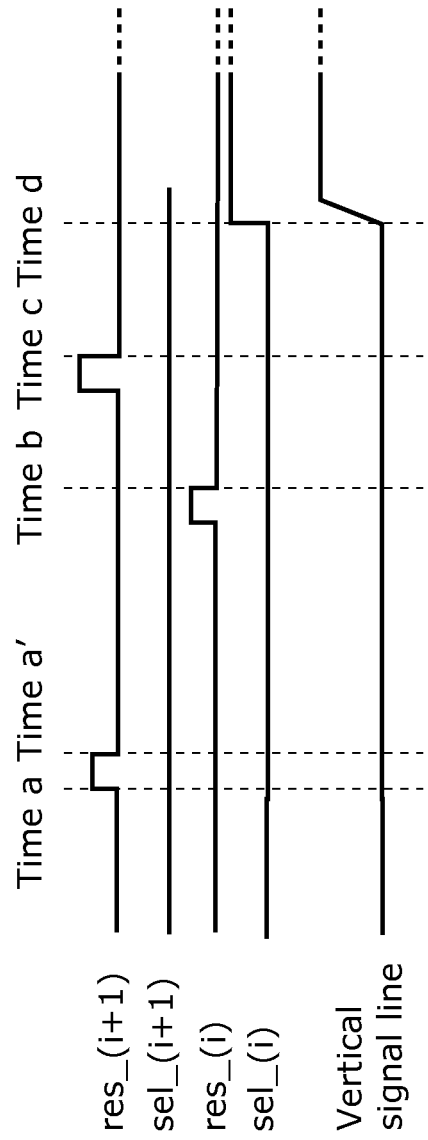
FIG. 3B illustrates the method for driving the solid-state imaging device according to Embodiment 1 of the present disclosure.

FIG. 3A and FIG. 3B each shows the method for driving the solid-state imaging device according to the present embodiment. Signals to be applied to each of the control lines are shown in time series. Although only the i-th row and (i+1)-th row are shown, those skilled in the art can easily apply this to a usual vertical scanning operation. The reset control line for the i-th row is represented as res_(i), and the select control line of the i-th row is represented as sel_(i). First, description is provided on FIG. 3A.

At Time a, the reset operation on the pixels in the (i+1)-th row is started by turning ON res_(i+1).

Between Time a and Time b, res_(i) is turned ON and the reset operation on the i-th row is started.

After that, at Time b, res_(i+1) is turned OFF and the reset operation on the i-th row is ended. Here, res_$_{(i+}$1) is kept turned ON.

After that, at Time c, res_(i+1) is turned OFF and the reset operation on the (i+1)-th row is ended. The voltages of the FD units 615 (storage capacitors 103(i)) at this time correspond to [Expression 1]. Specifically, the fluctuation in the FD units 615 in the (i+1)-th row (storage capacitors 103(i+1)) affects the FD units 615 in the i-th row (storage capacitors 103(i)). However, in the above-described driving method, when the voltages of the FD units 615 in the (i+1)-th row (storage capacitors 103(i+1)) at Time b are represented as Vfd2(i+1) and the voltages of the FD units 615 in the (i+1)-th row (storage capacitors 103(i+1)) at Time c are represented as Vfd3(i+1), the voltages of the FD units 615 in the i-th row (storage capacitor 103(i)) are represented by the following expression.

[Math 3]

$$Vres2(i)' = Vres1(i) + \frac{Cp}{Ca+Cp}(Vfd3_{(i+1)} - Vfd2_{(i+1)}) \quad (3)$$

At Time d, sel_(i) is turned ON and voltages of the FD units 615 in the i-th row (storage capacitors 103(i)) are provided to the vertical signal line. The output voltage value to the vertical signal lines at this time corresponds to [Expression 2].

[Math 4]

$$Vout(i)' = Vres1(i) + \frac{Cp}{Ca+Cp}(Vfd3_{(i+1)} - Vfd2_{(i+1)}) + \frac{Qa}{Ca} \quad (4)$$

Vfd2(i+1) is a value of the (i+1)-th row during the reset operation and Vfd3(i+1) is a value of the (i+1)-th row immediately after the reset operation, and both values are not dependent on the light irradiation amount. Assuming that Time b in FIG. 3A is in the frame previous to the frame including Time d at which the readout operation is performed, an output not dependent on a light irradiation state can be obtained at Time d regardless of the light irradiation state in the previous frame. Thus, the motion blur can be prevented and the object of the present disclosure is achieved.

Practically, by driving the solid-state imaging device in a manner that satisfies the driving method shown in FIG. 3A described above (an example of this is shown in the embodiments below), the motion blur can be removed.

FIG. 3B shows another driving method.

First, res_(i+1) is turned ON at Time a, and the reset operation on the (i+1)-th row is started.

After that, res_$_{(i+}$1) is turned OFF at Time a', and the reset operation on the (i+1)-th row is ended.

After that, res_(i) is turned OFF at Time b, and the reset operation on the i-th row is ended (res_(i) is turned ON before Time b).

After that, res_(i+1) is turned OFF at Time c, and the reset operation on the (i+1)-th row is ended (res_(i+1) is turned ON before Time c).

The operation at Time d is the same as in the driving method in FIG. 3A. When it is assumed that: the voltages of the FD units 615 in the i-th row (storage capacitors 103(i+1)) at Time b are represented as Vfd2 (i+1)'; and the voltages of the FD units 615 in the (i+1)-th row (storage capacitors 103 (i+1)) at Time c are represented as Vfd3 (i+1)', in the same manner as in FIG. 3A, the output voltage at Time d is represented by the following expression.

[Math 5]

$$Vout(i)'' = Vres1(i) + \frac{Cp}{Ca+Cp}(Vfd3'_{(i+1)} - Vfd2'_{(i+1)}) + \frac{Qa}{Ca} \quad (5)$$

Strictly speaking, Vfd2 (i+1)' is dependent on the light irradiation amount. However, by shortening the differential time of Time a' from Time b, it is possible to minimize the dependency. The shorter differential time is, the better. The differential time may be one scanning period, for example. The beneficial differential time may be at least shorter than the one-frame accumulation time (one-frame accumulation time is the same as in the usual driving method). Since Vfd3 (i+1)' is a voltage immediately after the reset operation and is not dependent on the light irradiation amount, it is possible to remove the motion blur in this method too, in the same manner.

In FIG. 3A and FIG. 3B, except the above-described portion, another driving method may also be considered. For example, it is only at Time d that sel_(i) needs to be always turned ON, and it may be turned ON or OFF at Time b. Specifically, the voltages of the FD units 615 in the (i+1)-th row (storage capacitors 103(i+1)) is set to values which are not dependent on the light irradiation amount, upon ending the reset operation on the i-th row.

[Embodiment 2]

Embodiment 2 according to the present disclosure is described with reference to FIG. 4 and FIG. 5. The overall configuration of the solid-state imaging device is the same as in Embodiment 1.

Figure 14:
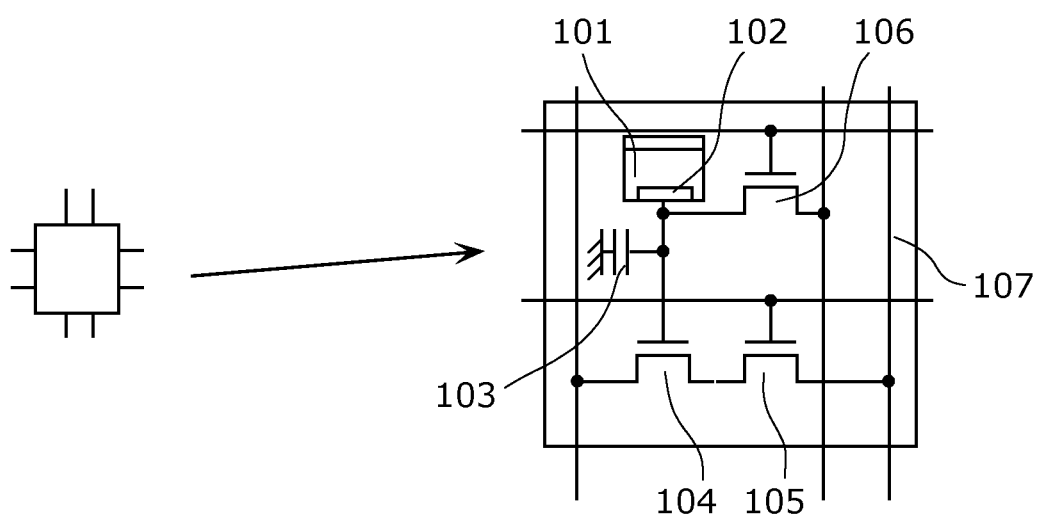
FIG. 14 illustrates a pixel of a conventional layered solid-state imaging device.

FIG. 4 is a schematic view of a pixel array 502 in the present embodiment. The pixel array 502 includes pixels arranged in n rows (n is an integer no less than 2) in a vertical scanning direction and m columns (m is a natural number) in a horizontal scanning direction. The circuit diagram for each pixel is the same as in FIG. 14, and the gates of the reset transistors 106 in each row are controlled by a single reset control line provided for each row. Likewise, the gates of the selection transistors 105 are controlled by a selection control line. Each row is numbered from 1 to n in the vertical scanning direction, and the reset control line of i-th row is represented as res_(i) and the selection control line is represented as sel_(i), where i is an integer no less than 1 and no greater than (n−1), in the same manner as in FIG. 16. In the driving method in the present embodiment, the signal is read out per row in the direction shown in the drawing (bottom to top), and the reset operation on all pixels in each row is performed prior to the readout operation by a time period for readout of j rows. In other words, the electronic shutter operation is performed. Thus, the accumulation time period of j rows is provided to the pixels. The row on which the electronic shutter operation is performed is represented as (i+j) and the like, and when this value exceeds n, the operation returns to the 1st row. Specifically, when (i+j) exceeds n, it means a value obtained by subtracting n from an original value (for example, (i+j) means (i+j−n)).

Figure 5:
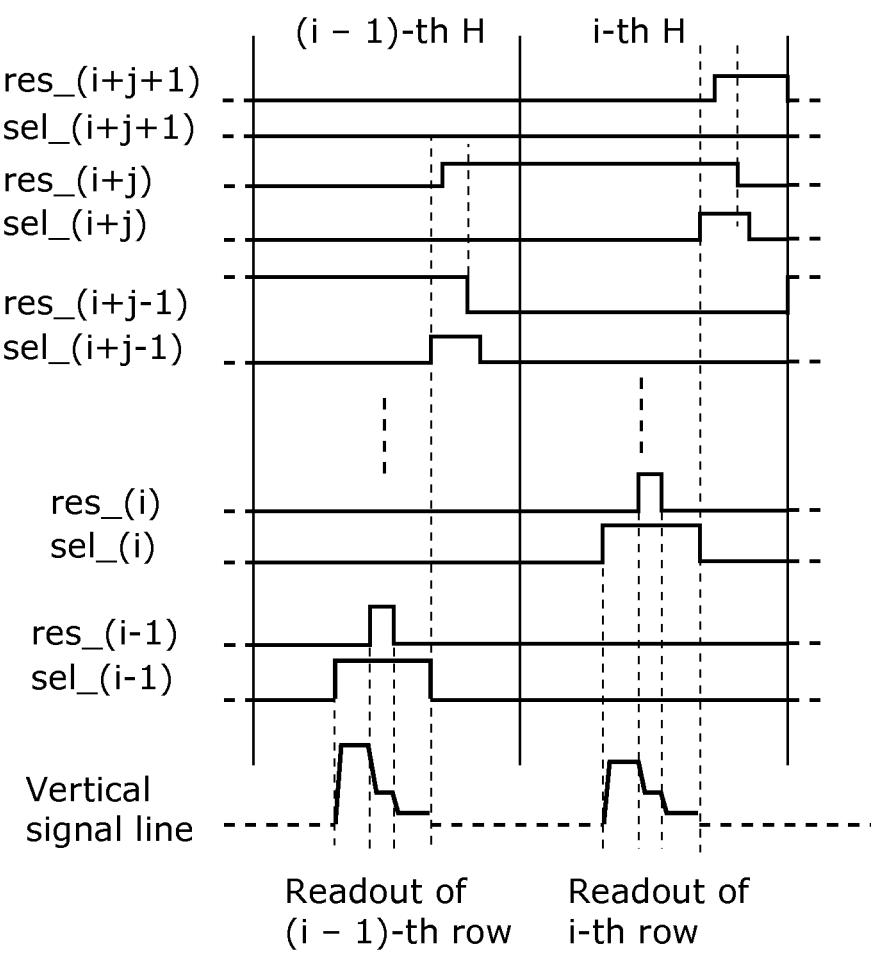
FIG. 5 illustrates a method for driving the solid-state imaging device according to Embodiment 2 of the present disclosure.

FIG. 5 shows a voltage applied to each control line and the output voltage which appears in a vertical signal line of a column in the present embodiment, to illustrate the typical driving method. FIG. 5 shows only (i−1)-th row and i-th row as rows on which the readout operation is performed, and only (i+j−1)-th row to (i+j+1)-th row as the rows on which the electronic shutter operation is performed. Since those skilled in the art can easily understand that pixel signals for one screen can be obtained by performing the same driving sequentially from the 1st row to the n-th row, the description is omitted. Furthermore, the driving period for the i-th row is represented as i-th scanning period (i-th H), and the driving period of the (i−1)-th row is represented as (i−1)-th scanning period ((i−1)-th H).

In the (i−1)-th scanning period, res_(i+j) is turned ON to start the reset operation on the pixels in the (i+j)-th row, and this state is kept until the reset operation on the pixels in the (i+j+1)-th row is started in the i-th scanning period. Subsequently, sel_(i+j) is turned ON and then res_(i+j) is turned OFF, and sel_(i+j) is turned OFF. With such a driving, the charge accumulation units in the (i+j)-th row are not affected by the potential fluctuation caused by the parasitic capacitance entailed with the start of the reset operation on the (i+j+1)-th row, from when the reset operation is ended to when the readout is started. In other words, the motion blur is not caused.

It is to be noted that the reset control line of the pixels in the (i+j−1)-th row is switched from ON to OFF, in the (i−1)-th scanning period. Furthermore, the (i−1)-th row in FIG. 5 is read out in the (i−1)-th scanning period, and the i-th row in FIG. 5 is read out in the i-th scanning period, in the same manner as in FIG. 16.

As described above, in the present embodiment, during the electronic shutter operation, capturing of high-quality image with no motion blur can be realized. Although FIG. 5 only describes the shutter time period of j rows, it is clear in principle that this functions for a time period over one frame.

Figure 16:
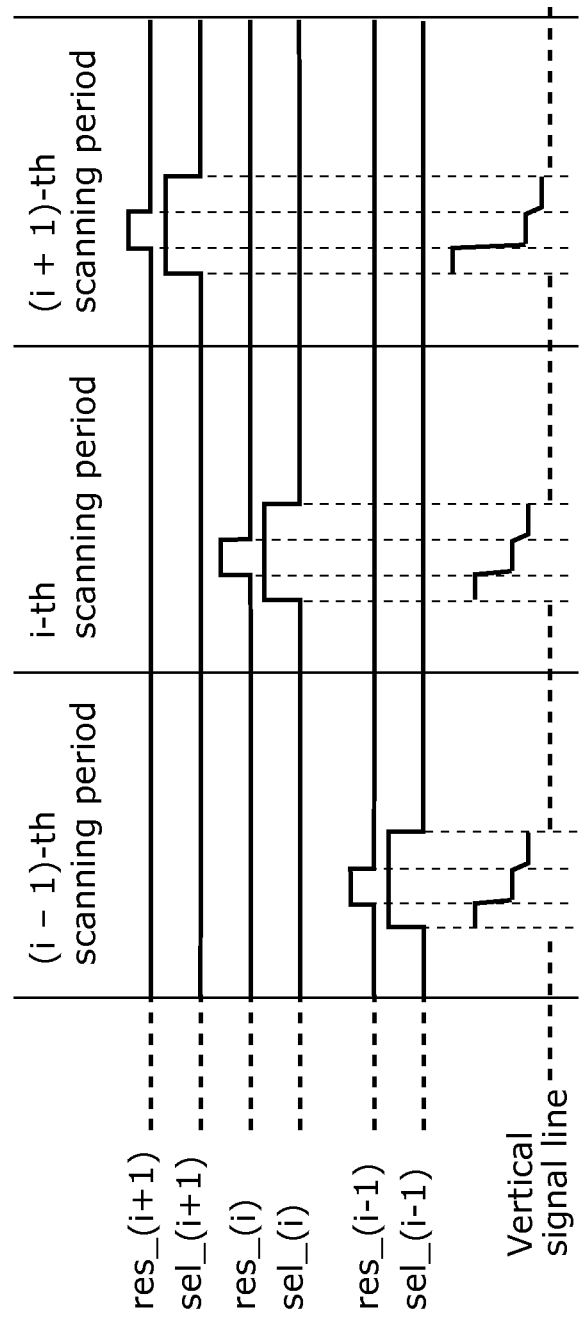
FIG. 16 illustrates a method for driving the solid-state imaging device.
Figure 17:
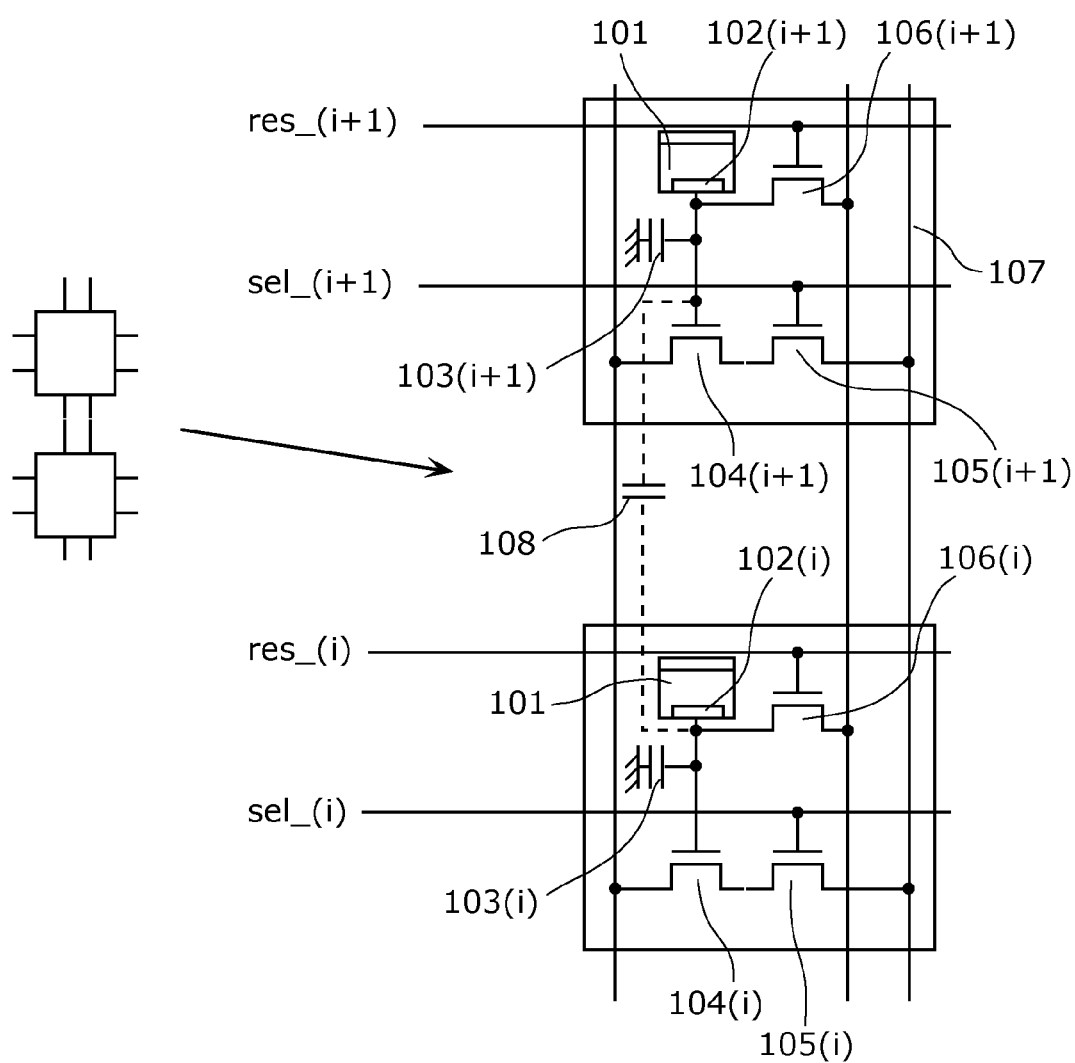
FIG. 17 illustrates a pixel unit of the solid-state imaging device.

It is to be noted that the operations of readout of pixel signal and readout of reset signal are not described since they are the same as in FIG. 16.

[Embodiment 3]

A solid-state imaging device according to Embodiment 3 of the present disclosure is described with reference to FIG. 6A and FIG. 6B. The configuration of the solid-state imaging device in the present embodiment is the same as that of FIG. 1, and the sectional structure of the pixel unit is the same as that of FIG. 2.

The present embodiment is described based on driving for capturing video without using an electronic shutter, that is, a rolling reset operation. In this case, it is sufficient to apply the driving method shown in FIG. 3A and FIG. 3B in Embodiment 1 to each scanning period, and to add a reset signal sampling operation. Details are described below.

Figure 6A:
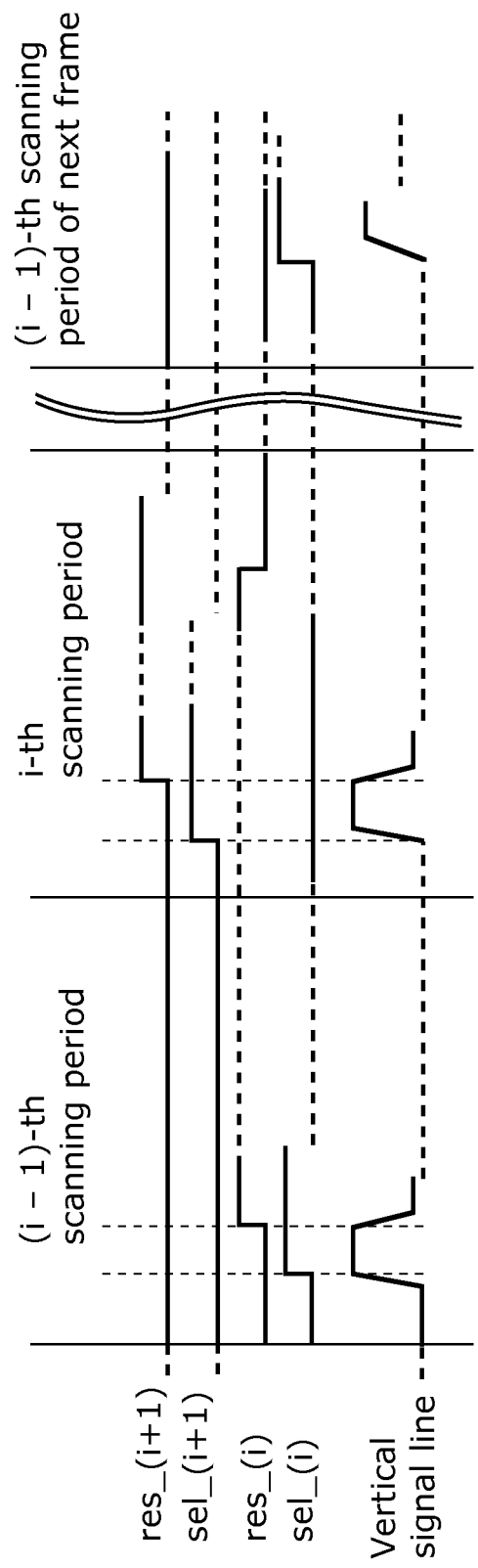
FIG. 6A illustrates a method for driving a solid-state imaging device according to Embodiment 3 of the present disclosure.

In FIG. 6A, sel_(i) is turned ON first in the (i−1)-th scanning period, and the pixel signals of the i-th row are read out. Then, res_(i) is turned ON and the reset operation on the i-th row is started.

In the i-th scanning period, sel_(i+1) is turned ON first, and the pixel signals of the (i+1)-th row are read out. Then, res_(i+1) is turned ON and the reset operation is started. Then, res_(i) is turned OFF (res_(i) is turned ON at any time before this operation), and the reset operation on the i-th row is ended. Since the charge amount in the charge accumulation unit in the (i+1)-th row is not dependent on the light irradiation amount, motion blur can be prevented by this driving method according to the principle described in Embodiment 1.

Here, the ON/OFF operation on the res_(i+1) may be performed arbitrarily, from when res_(i+1) is turned ON to when res_(i) is turned OFF in the i-th scanning period. It is to be noted that res_(i) has been turned ON immediately before turning OFF res_(i) (to be exact, extra time is needed for the storage capacitors to respond). Furthermore, res_(i) may be turned ON in advance at arbitrary time point (note that response time of the charge accumulation units etc. needs to be taken into consideration).

Figure 6B:
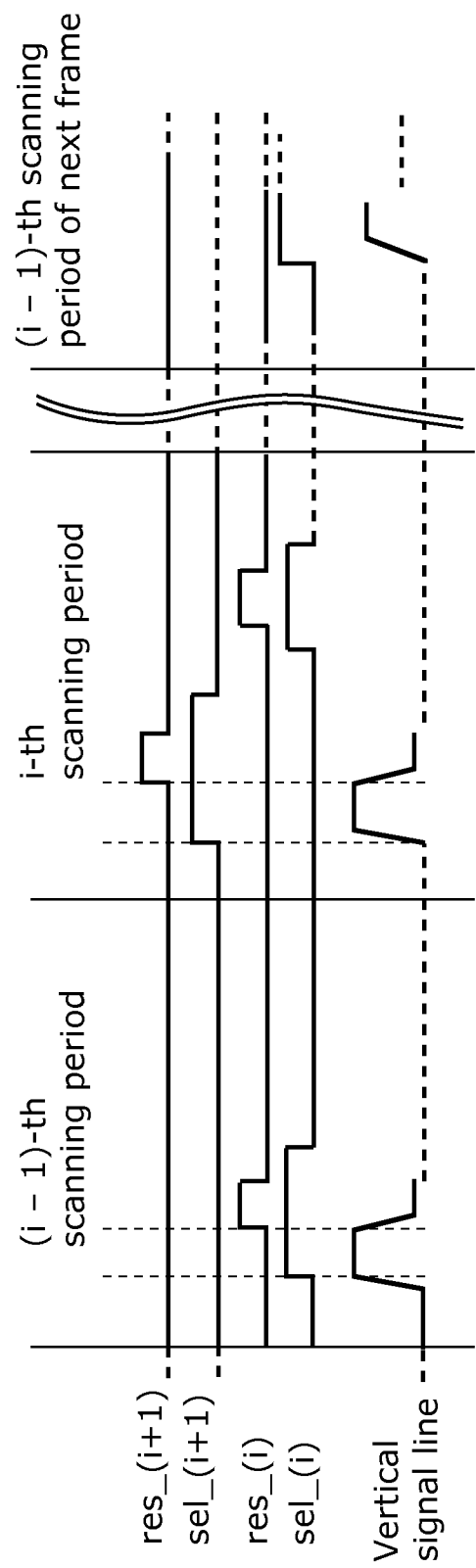
FIG. 6B illustrates the method for driving the solid-state imaging device according to Embodiment 3 of the present disclosure.

In FIG. 6B, sel_(i) is turned ON first in the (i−1)-th scanning period, and the pixel signals of the i-th row are read out. Then, res_(i) is turned ON and the reset operation on the i-th row is started. After the above state is kept for the time period needed to reset the pixels, res_(i) is turned OFF.

In the i-th scanning period, sel_(i+1) is turned ON first, and the pixel signals of the (i+1)-th row are read out. Then, res_(i+1) is turned ON and the reset operation is started. After the above state is kept for the time period needed to reset the pixels, res_(i+1) is turned OFF. Then, sel_(i) and res_(i) are turned ON, and the reset operation on the i-th row is started (here, sel_(i) is not necessarily turned ON, while ON may be beneficial to prevent the output signal from being affected by the parasitic element between a gate control line of the selection transistor and the charge accumulation units). Then, res_(i) is turned OFF and the reset operation is ended. The charge amount in the charge accumulation units in the (i+1)-th row is not dependent on the light irradiation amount, if any. Therefore, motion blur can be prevented by this driving method according to the principle described in Embodiment 1.

In the driving method described in the present embodiment, readout of reset signal is not included. There are roughly two types of arbitrary property depending on at which time point the reset signal is read out. The two arbitrary properties are, specifically, to read out the reset signals of the i-th row in the (i−1)-th scanning period or in the i-th scanning period. Description on a specific example of the above is provided in Embodiment 4 and Embodiment

[Embodiment 4]

A solid-state imaging device according to Embodiment 4 of the present disclosure is described with reference to FIG. 7 and FIG. 8. The configuration of the solid-state imaging device in the present embodiment is the same as that of FIG. 1, and the sectional structure of the pixel unit is the same as that of FIG. 2.

Figure 15:
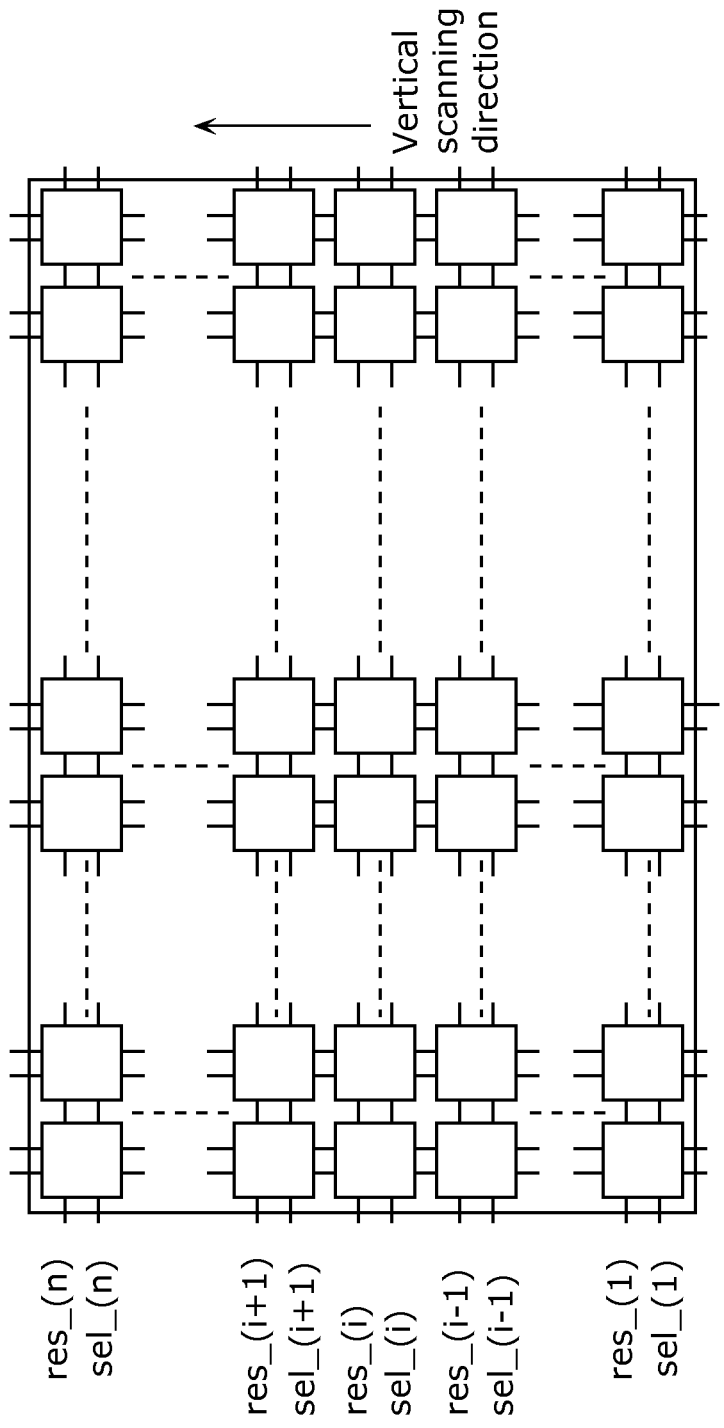
FIG. 15 illustrates a pixel array of a solid-state imaging device.

FIG. 7 shows a schematic view of the pixel array 502 in the present embodiment, which is the same as that of FIG. 15. The pixel array 502 includes pixels arranged in n rows (n is an integer no less than 2). The circuit diagram for each pixel is the same as in FIG. 14, and the gates of the reset transistors 106 in each row are controlled by a single reset control line provided for each row. Likewise, the gates of the selection transistors 105 are controlled by a selection control line. Each row is numbered from 1 to n in the vertical scanning direction, and a reset control line of i-th row is represented as res_(i), and a selection control line of i-th row is represented as sel_(i), where i is an integer no less than 1 and no greater than (n−1), in the same manner as in FIG. 16. In the driving method in the present embodiment, the signals are read out per row in the direction shown in the drawing (bottom to top). In the lower stage of the pixel array 502, a column amplifier 904 which belongs to the column amplifier circuit 504 and a noise cancelling circuit 905, for one column, which belongs to the noise cancelling circuit 505 are shown. The noise cancelling circuit 905 is formed with (i) a first correlation double sampling circuit (first CDS circuit) including a switch 906, a capacitor 907, a switch 908, a capacitor 909, and a switch 910 and (ii) a second correlation double sampling circuit (second CDS circuit) including a switch 911, a capacitor 912, a switch 913, a capacitor 914, and a switch 915, connected in parallel.

Figure 8:
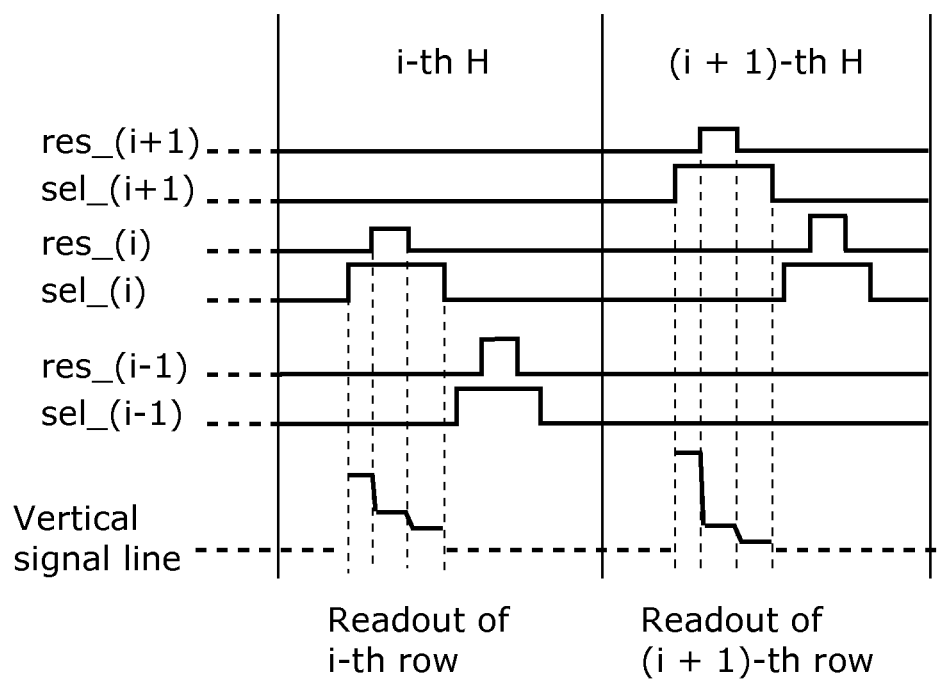
FIG. 8 illustrates a method for driving the solid-state imaging device according to Embodiment 4 of the present disclosure.

FIG. 8 shows a voltage applied to each control line and the output voltage which appears in a vertical signal line of a column in the present embodiment, to illustrate the typical driving method. FIG. 8 shows only (i−1)-th row to (i+1)-th row as rows on which the readout operation is performed. Since those skilled in the art can easily understand that pixel signals for one screen can be obtained by performing the same driving sequentially from the 1st row to the n-th row, the description is omitted. Furthermore, the driving period for the i-th row is represented as i-th scanning period (i-th H), and the driving period for the (i+1)-th row is represented as (i+1)-th scanning period ((i+1)-th H).

In the i-th scanning period, first, sel_(i) is turned ON and the selection transistors 105 in the pixels in the i-th row are turned ON. Thus, voltages V1 corresponding to the charges accumulated in the charge accumulation units 103 are generated by the pixel readout transistors 104 and provided to the vertical signal lines 107. This operation is performed with the switch 906 turned ON, and the sampling is performed by the first CDS circuit. Next, the reset operation on the i-th row is started. Specifically, the switch 906 is turned OFF, res_(i) is turned ON, and the charge accumulation units 103 are reset by the reset transistors 106 (a reset voltage is applied to the reset transistors 106 by a voltage supply or the like in advance). After that, res_(i) is turned OFF to end the first reset operation on the i-th row. At this time, sampling on the output after the reset of the i-th row is not performed by the second CDS circuits.

Next, in the (i+1)-th scanning period, in the same manner as the above, sel_(i+1) is turned ON and the selection transistors 105 of the pixels in the (i+1)-th row are turned ON. Thus, voltages V1 corresponding to the charges accumulated in the charge accumulation units 103 are generated by the pixel readout transistors 104 and provided to the vertical signal lines 107. This operation is performed with the switch 911 turned ON, and the sampling is performed by the second CDS circuit. Next, the reset operation on the i-th row is started. Specifically, the switch 906 is turned OFF, res_(i+1) is turned ON, and the charge accumulation units 103 are reset by the reset transistors 106 (a reset voltage is applied to the reset transistors 106 by a voltage supply or the like in advance). After that, res_(i+1) is turned OFF to end the first reset operation on the (i+1)-th row. At this time, sampling on the output after the reset of the (i+1)-th row is not performed by the second CDS circuit.

Next, the second reset operation on the i-th row is started. Specifically, the switch 906 is turned ON again, sel_(i) and res_(i) are turned ON, and then res_(i) and sel_(i) are turned OFF in this order. The vertical output signals V2 at this time are sampled by the first CDS circuit. Thus, differences between the above-described sampling voltages V1 and the voltages V2 can be obtained as the output voltage of the first CDS circuits. After that, the output voltage of the CDS circuits obtained in each column are sequentially output outside of the solid-state imaging device by the horizontal driver circuit, and the driving of the i-th scanning period is ended. The same goes for the operation of the (i+1)-th scanning period that follows and the subsequent scanning periods. When the n-th scanning period is ended, from the 1st scanning period of the next frame, the same driving is repeated. The output voltage V1 in the current frame is the voltages obtained by adding, to the output voltage V2 of the previous frame, only the voltage which is (i) corresponding to the intensity of the light which is irradiated to each pixel and (ii) not affected by the coupling due to the reset operation. Therefore, the voltages (V1-V2) obtained by the CDS circuits are the true image signals depending only on the light intensity. Accordingly, in the present embodiment too, high-quality image with no motion blur can be captured.

[Embodiment 5]

Figure 9:
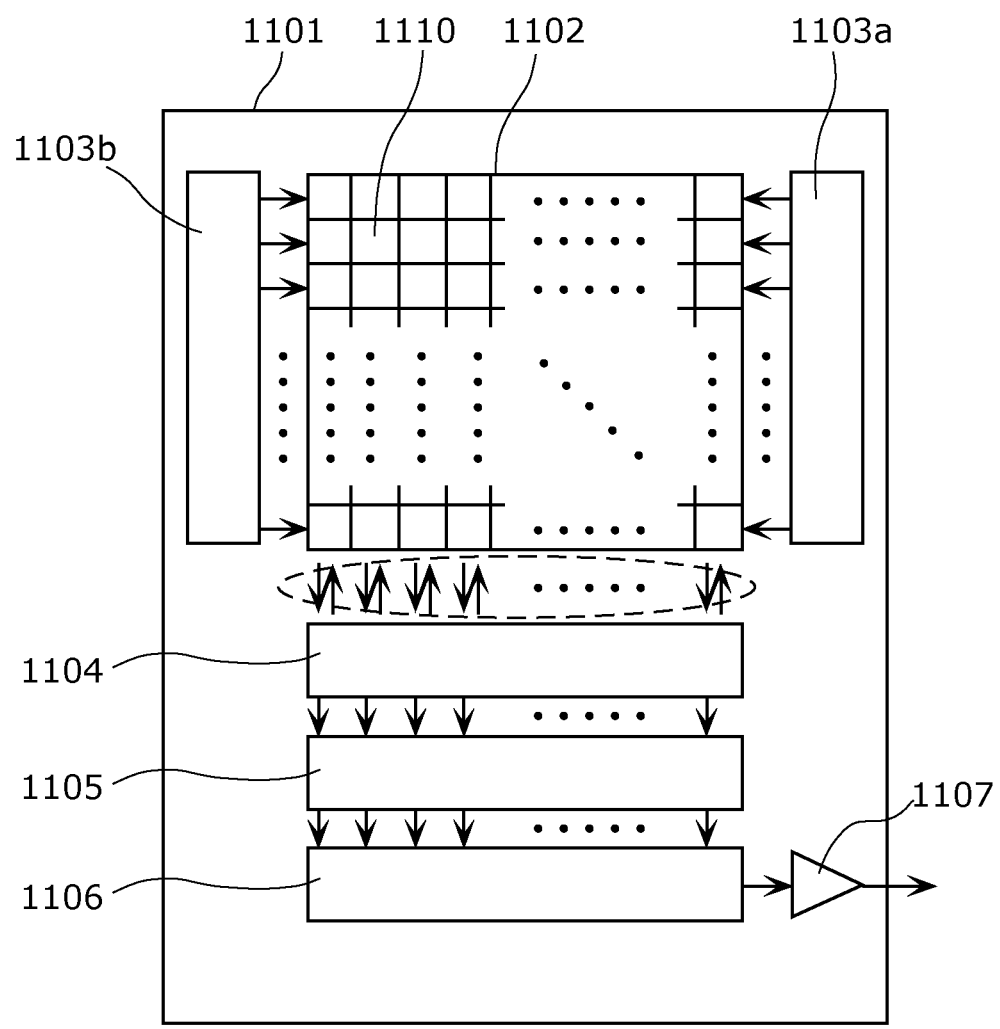
FIG. 9 illustrates a solid-state imaging device according to Embodiment 5 of the present disclosure.

FIG. 9 is a block diagram showing a configuration of a solid-state imaging device 1101 according to Embodiment 5 of the present disclosure. This solid-state imaging device 1101 includes a pixel array 1102, row-signal driver circuits 1103a and 1103b, a column feedback amplifier circuit 1104 in which a circuit having an amplification function and a feedback function is provided for each column, a noise cancelling circuit 1105 in which a column amplifier and a noise canceller is provided for each column, a horizontal driver circuit 1106, and an output stage amplifier 1107. The column feedback amplifier circuit 1104 receives an output signal from the pixel array 1102 and feeds it back. Thus, the signal flows in both directions, i.e., from and to the pixel array 1102 as shown in FIG. 9.

Figure 10:
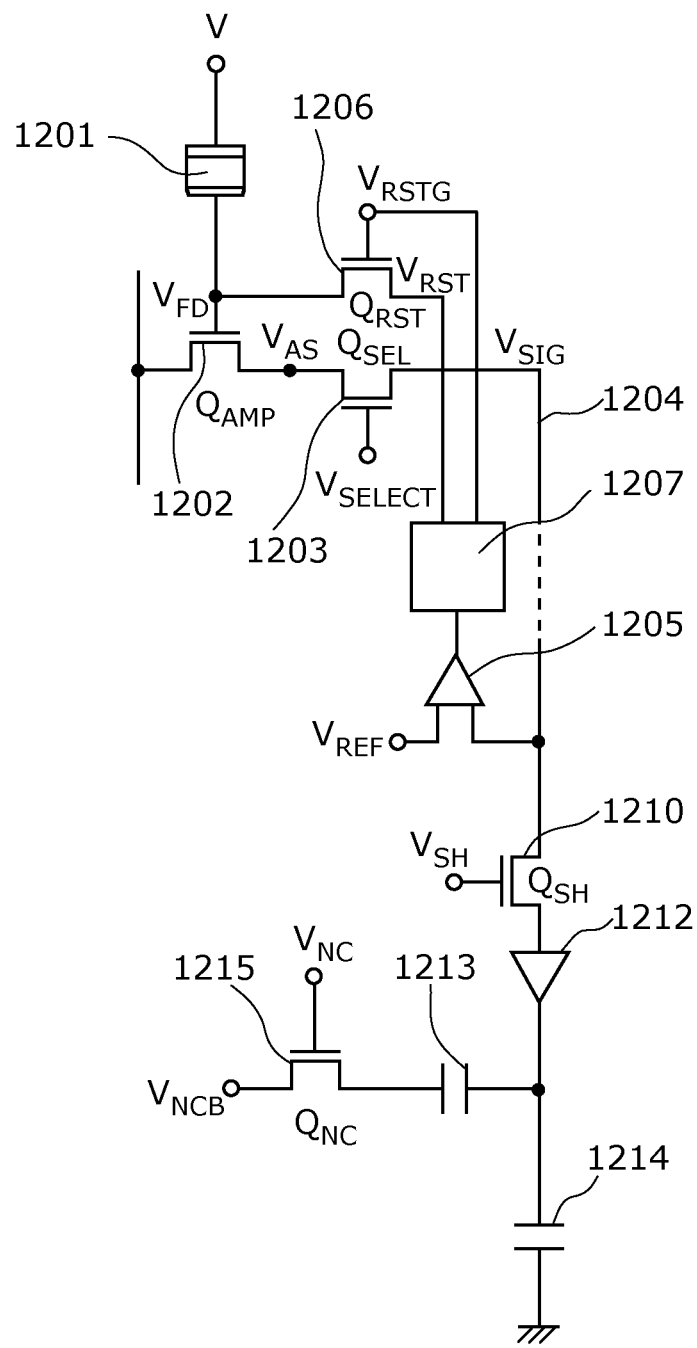
FIG. 10 illustrates the solid-state imaging device according to Embodiment 5 of the present disclosure.

FIG. 10 illustrates a circuit diagram showing a signal readout circuit for one pixel 1110 and the peripheral circuitry which are included in the solid-state imaging device 1101.

The pixel array 1102 includes pixels 1110 arranged in a matrix, column signal lines (vertical signal lines) 1204 provided for respective columns, and row selection lines provided for respective rows. Each of the vertical signal lines 1204 is connected to pixels 1110 arranged along a corresponding one of the columns. Each of the row selection lines is connected to pixels 1110 arranged along a corresponding one of the rows.

As shown in FIG. 10, the pixel 1110 includes the photoelectric conversion unit 1201 and the signal readout circuit. Furthermore, the solid-state imaging device 1101 includes: a vertical signal line 1204; a feedback amplifier 1205; a control circuit 1207 which controls a level of an input to the reset transistor 1206 according to an output from the feedback amplifier 1205; an amplification transistor 1202, a selection transistor 1203; a column amplifier circuit 1212; a transistor 1210; and capacitors 1213 and 1214. The vertical signal line 1204, the feedback amplifier 1205, the control circuit 1207, the selection transistor 1203, the column amplifier circuit 1212, the transistors 1210 and 1215, and the capacitors 1213 and 1214, are provided for each column, and are included in the column feedback amplifier circuit 1104, the noise cancelling circuit 1105, and the like shown in FIG. 9.

The photoelectric conversion unit 1201 generates signal charges corresponding to an amount of incident light by converting incoming photons into electrons.

The signal readout circuit generates a readout signal corresponding to the signal charges generated in the photoelectric conversion unit 1201. The signal readout circuit includes an amplification transistor 1202, a selection transistor 1203, a reset transistor 1206, and a FD unit (floating diffusion unit) (not shown and the node voltage is represented as $V_{FD}$).

The amplification transistor 1202 detects the amount of the signal charges generated in the photoelectric conversion unit 1201.

The selection transistor 1203 controls whether or not to transmit the signal detected by the amplification transistor 1202 to the vertical signal line 1204.

The reset transistor 1206 provides to the FD unit a reset signal for resetting the photoelectric conversion unit 1201 and the FD unit.

The control circuit 1207 controls via the signal line the ON/OFF state of the reset transistor 1206 according to the output from the feedback amplifier 1205, while applying, to the photoelectric conversion unit 1201 via the signal line, the level of input to the reset transistor 1206 as a ground potential (hereinafter, referred to as GND) or a high-level potential (hereinafter, referred to as $V_{HIGH}$).

The selection transistor 1203 controls whether or not to transmit a pixel output signal $V_{PIXO}$ to an input terminal of the column amplifier circuit 1212.

The transistor 1215 and the capacitors 1213 and 1214 are connected in series. The transistor 1215 controls whether or not to apply a bias voltage $V_{NCB}$ to the capacitor 1213.

The signal amplified by the column amplifier circuit 1212 is provided to a difference circuit including the transistor 1215 and the capacitors 1213 and 1214. The difference circuit detects a voltage corresponding to the signal by a difference operation.

It is to be noted that, in the present embodiment, the configuration of the pixel array 1102 is the same as that in Embodiment 2 (FIG. 4).

Figure 11:
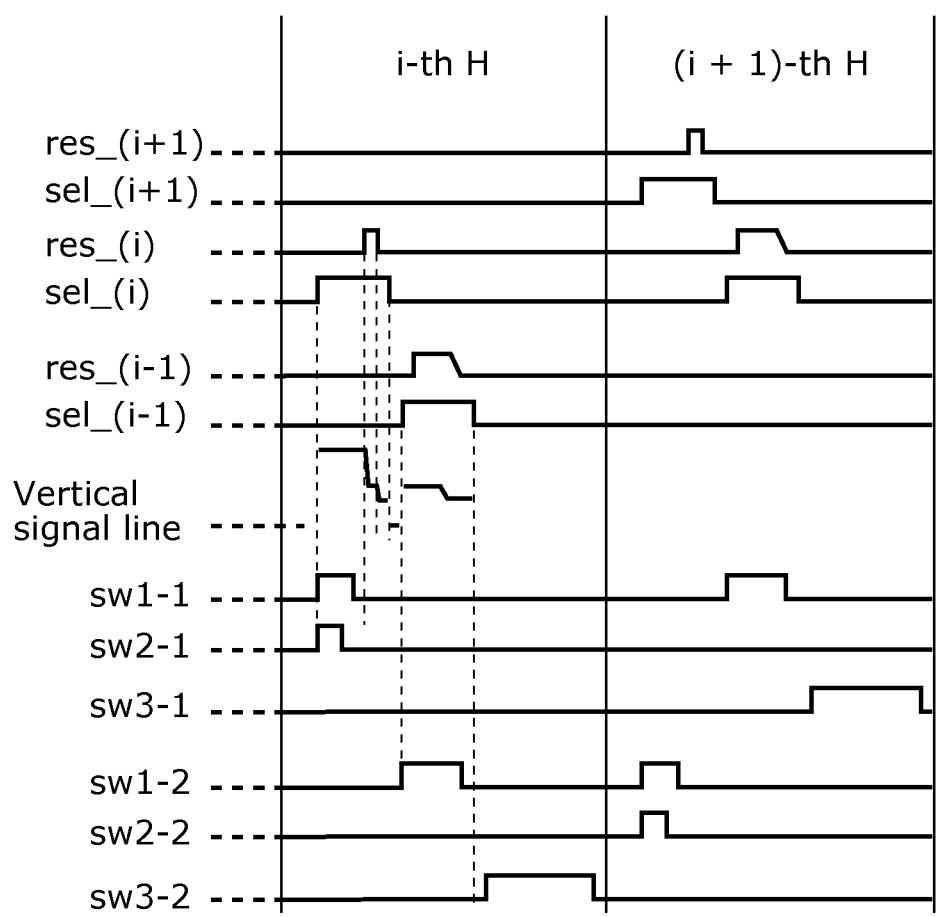
FIG. 11 illustrates a method for driving the solid-state imaging device according to Embodiment 5 of the present disclosure

FIG. 11 shows a voltage applied to each control line and the output voltage which appears in a vertical signal line of a column to illustrate the typical driving method. FIG. 11 shows only (i−1)-th row to (i+1)-th row as rows on which the readout operation is performed. Since those skilled in the art can easily understand that pixel signals for one screen can be obtained by performing the same driving sequentially from the 1st row to the n-th row, the description is omitted. Furthermore, the driving period for the i-th row is represented as i-th scanning period (i-th H), and the driving period for the (i−1)-th row is represented as (i−1)-th scanning period ((i−1)-th H). Furthermore, description is provided based on an assumption that the noise cancelling circuit 1105 has the same configuration as the noise cancelling circuit 905.

In the i-th scanning period, first, sel_(i) is turned ON and the selection transistors 1203 in the pixels in the i-th row are turned ON. Thus, voltages V1 corresponding to the charges accumulated in the FD units are generated by the amplification transistors 1202 and provided to the column signal lines 1204. This operation is performed with the switch 906 turned ON, and the sampling is performed by the first CDS circuit. Next, the reset operation on the i-th row is started. Specifically, the switch 906 is turned OFF, res_(i) is turned ON, and the FD units are reset by the reset transistors 1206 (a reset voltage is applied to the reset transistors 1206 by a voltage supply or the like in advance). After that, res_(i) is turned OFF to end the first reset operation on the i-th row. At this time, sampling on the output after the reset of the i-th row is not performed by the second CDS circuits.

Next, in the (i+1)-th scanning period, in the same manner as the above, sel_(i+1) is turned ON and the selection transistors 1203 of the pixels in the (i+1)-th row are turned ON. Thus, voltages V1 corresponding to the charges accumulated in the FD units are generated by the amplification transistors 1202 and provided to the column signal lines 1204. This operation is performed with the switch 911 turned ON, and the sampling is performed by the second CDS circuit. Next, the reset operation on the i-th row is started. Specifically, the switch 906 is turned OFF, res_(i+1) is turned ON, and the FD units are reset by the reset transistors 1206 (a reset voltage is applied to the reset transistors 1206 by a voltage supply or the like in advance). After that, res_(i+1) is turned OFF to end the first reset operation on the (i+1)-th row. At this time, sampling on the output after the reset of the (i+1)-th row is not performed by the second CDS circuit.

Next, the second reset operation on the i-th row is started. Specifically, the switch 906 is turned ON again, sel_(i) and res_(i) are turned ON, and then res_(i) and sel_(i) are turned OFF in this order. The vertical output signals V2 at this time are sampled by the first CDS circuit. Thus, differences between the above-described sampling voltages V1 and the voltages V2 can be obtained as the output voltage of the first CDS circuits. After that, the output voltage of the CDS circuits obtained in each column are sequentially output outside of the solid-state imaging device by the horizontal driver circuit, and the driving of the i-th scanning period is ended. The same goes for the operation of the (i+1)-th scanning period that follows and the subsequent scanning periods. When the n-th scanning period is ended, from the 1st scanning period of the next frame, the same driving is repeated. The output voltage V1 in the current frame is the voltages obtained by adding, to the output voltage V2 of the previous frame, only the voltage which is (i) corresponding to the intensity of the light which is irradiated to each pixel and (ii) not affected by the coupling due to the reset operation. Therefore, the voltages (V1-V2) obtained by the CDS circuits are the true image signals depending only on the light intensity. Accordingly, in the present embodiment too, high-quality image with no motion blur can be captured. Here, the reset operation is performed via the feedback amplifier 1205 and with the output fed back. With such a configuration, the noise which appears in the output can be reversed and fed back to the input, summed with a positive sign component, and cancelled. Furthermore, upon ending the second reset operation on the i-th row, the reset signal is set to be in a tapered shape, thereby preventing a drastic reset operation. With such a reset operation, the bandwidth of the feedback loop can be limited and higher noise reduction effects can be provided. This taper reset operation is not necessary in the first reset operation in the present embodiment, while higher noise reduction effects can be provided with the taper reset operation in the case where the signal immediately after the first reset operation is sampled and referenced as the zero-level.

[Embodiment 6]

A method for driving a solid-state imaging device according to Embodiment 6 of the present disclosure is described with reference to FIG. 12 and FIG. 13. The configuration of the solid-state imaging device in the present embodiment is the same as that of FIG. 1, and the sectional structure of the pixel unit is the same as that of FIG. 2.

Figure 12:
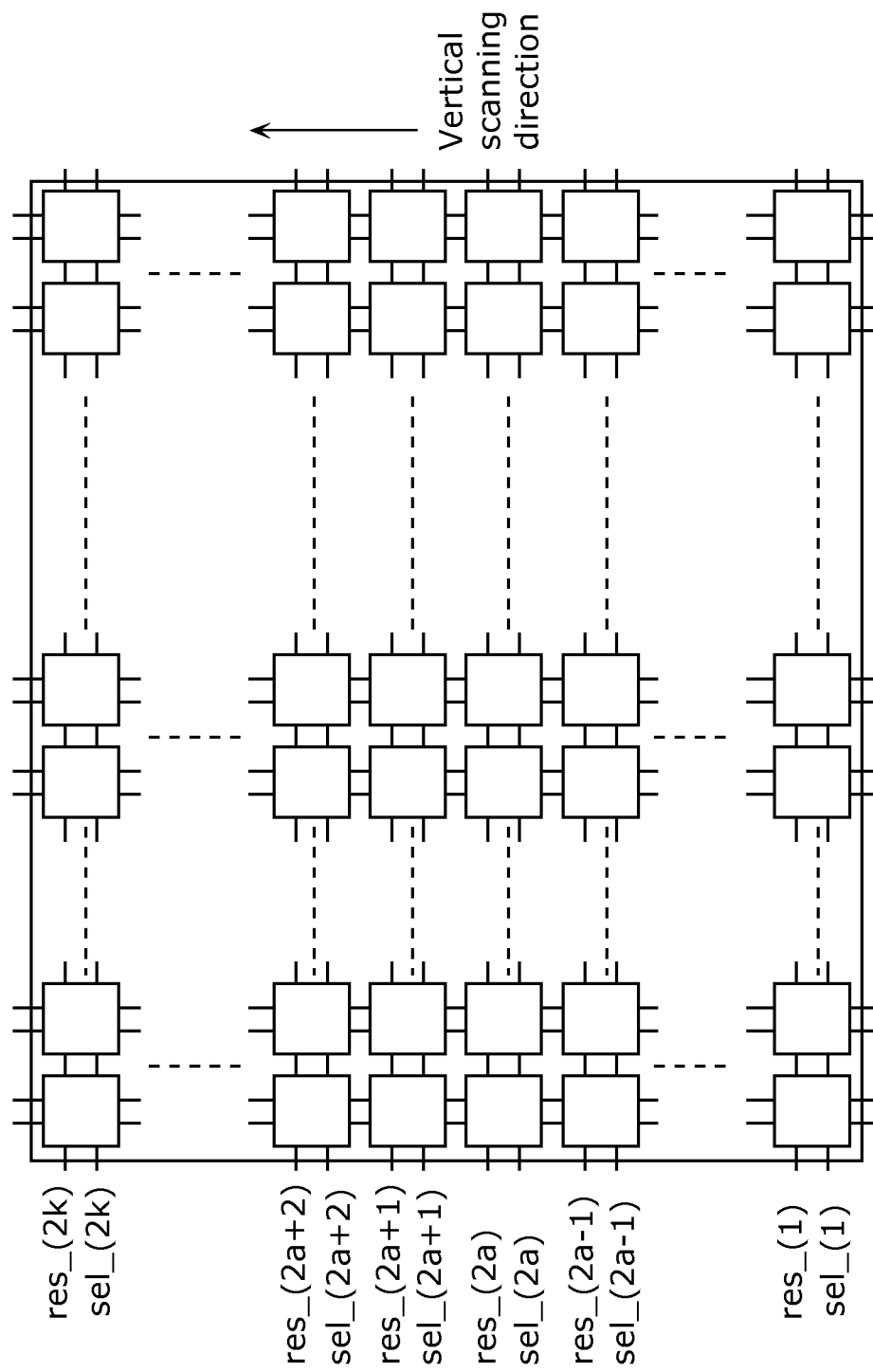
FIG. 12 illustrates a solid-state imaging device according to Embodiment 6 of the present disclosure.

FIG. 12 shows a schematic view of the pixel array 502 in the present embodiment, which is the same as that of FIG. 15. The pixel array 502 includes pixels arranged in 2k rows (2k is equal to n). Or, when the number of the rows is an odd number, the number of the rows can be represented as (2k+1) rows. Although description is not provided on the case of the odd number because it is complicated, the same concept may be adopted. a is an integer no less than 0 and no greater than k.

Figure 13:
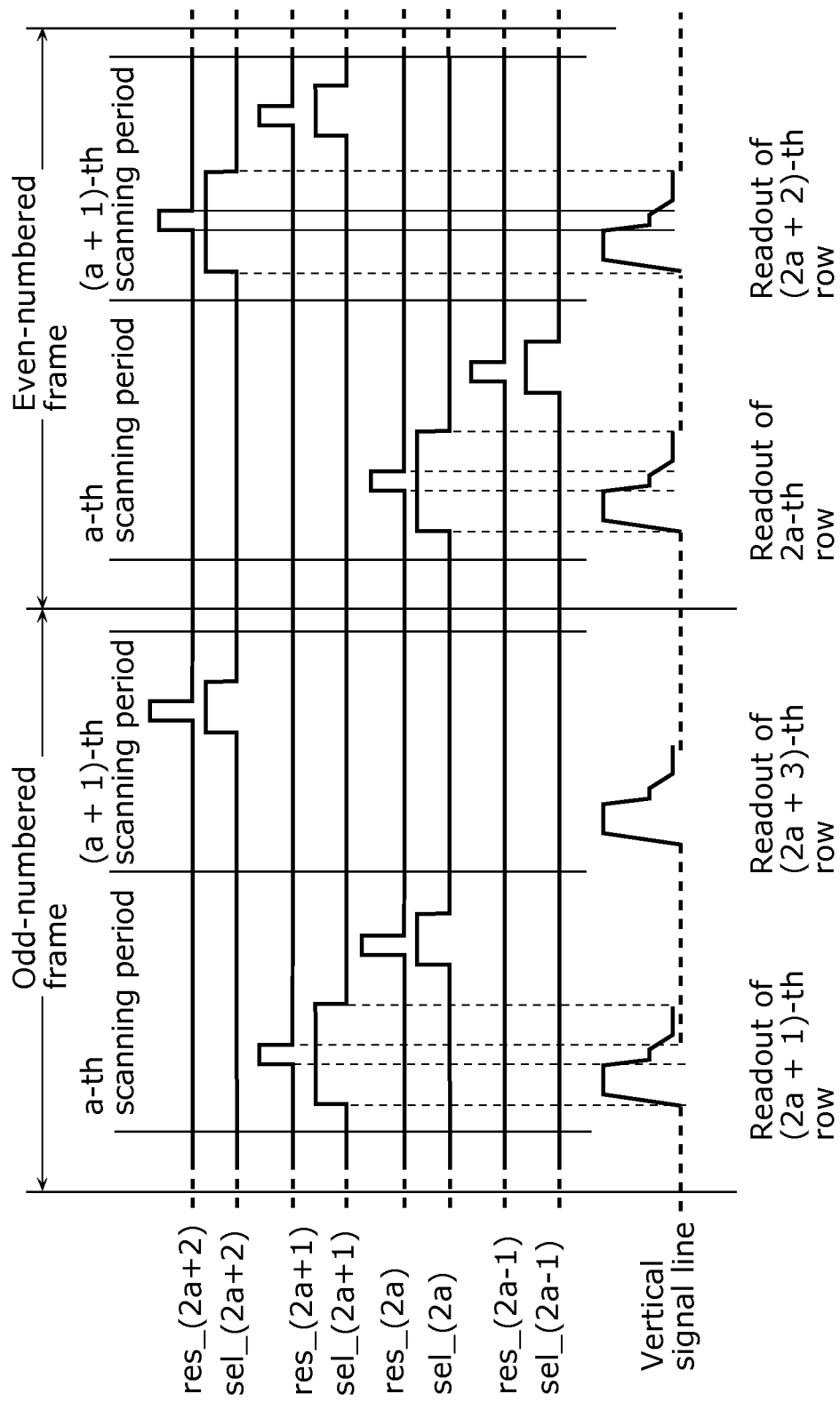
FIG. 13 illustrates a method for driving the solid-state imaging device according to Embodiment 6 of the present disclosure.

FIG. 13 shows the driving method according to the present embodiment. FIG. 13 shows so-called interlaced driving. Signals of odd-numbered rows are read out in an odd-numbered frame, while signals of even-numbered rows are read out in an even-numbered frame (the opposite combination is also possible). Signals of k rows are read in each frame.

In an odd-numbered frame, a pixel signal in the (2a+1)-th row is read out in the a-th scanning period. As a specific operation, first, sel_(2a+1) is turned ON, voltages corresponding to the accumulated charge amount are read out to the vertical signal lines, and sampling is performed by the CDS circuits or the like. Next, res_(2a+1) is turned ON and a reset operation is started. Next, res_(2a+1) is turned OFF and the reset operation is ended, and then the reset signals are read out from the vertical signal lines, and sampling is performed by the CDS circuits or the like. Then, res_(2a) is turned ON and the reset operation on the 2a-th row is started. After that, res_(2a) is turned OFF and the reset operation is ended. At this time, the time elapsed from when the reset operation on the (2a+1)-th row is ended is shorter than one scanning period. Therefore, in this reset operation on the 2a-th row, there is almost no impact from the light irradiation amount of the (2a+1)-th row, thereby preventing the motion blur. During the reset operation on the 2a-th row, sel_(2a) may be turned ON or OFF (ON in FIG. 13), while it is beneficial to turn it ON for reducing the impact on the output signal by the parasitic element of the gate control line of the transistor selection and the storage capacitors.

In the a-th scanning period in an even-numbered frame, the (2a+1)-th row in the a-th scanning period in the above-described odd-numbered frame is replaced by the 2a-th row, and the 2a-th row in the a-th scanning period in the above-described odd-numbered frame is replaced by the (2a−1)-th row. This operation allows ensuring accumulation time for one frame and preventing the motion blur.

The above has described each exemplary embodiment, however, the scope of the claims of the present application is not limited to the above embodiments. Those skilled in the art will readily appreciate that many modifications are possible in the exemplary embodiments and other embodiments may be obtained by arbitrarily combining the constituent elements in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful for digital still cameras, digital video cameras, and so on.

The invention claimed is:

1. A method for driving a solid-state imaging device including pixels arranged in a two-dimensional array of m columns in a horizontal scanning direction and n rows in a vertical scanning direction, where n is an integer no less than 2 and m is a natural number, wherein each of the pixels includes (i) a photoelectric converting unit which includes a photoelectric film, (ii) a charge accumulation unit which accumulates signal charges output from the photoelectric conversion unit, (iii) a selection transistor which reads out pixel signals associated with fluctuation in an amount of accumulated signal charges, and (iv) a reset transistor which starts or ends a reset operation to reset the signal charges in the charge accumulating unit, the method comprising:

reading out pixel signals of the pixels sequentially from a first row to an n-th row in one frame; and ending a reset operation on pixels in an i-th row among the pixels when (i) a reset operation on pixels in an (i+1)-th row among the pixels is in progress or (ii) time elapsed from when the reset operation on the pixels in the (i+1)-th row is ended is less than one-frame capturing time, where i is an integer no less than 1 and no greater than (n−1), wherein the method further comprises, in the following order, (i) in an L-th frame, reading out pixel signals in the (i+1)-th row, (ii) in an (L+1)-th frame immediately following the L-th frame, starting the reset operation on the (i+1)-th row, (iii) in the (L+1)-th frame, starting the reset operation on the i-th row, (iv) in the (L+1)-th frame, ending the reset operation on the i-th row, and (v) in the (L+1)-th frame, reading out pixel signals in the i-th row, where L is a natural number.

2. The method for driving a solid-state imaging device according to claim 1, further comprising:

driving an electronic shutter which provides an accumulation time period of j horizontal scanning periods, where j is an integer no less than 1 and no greater than (n−1); and starting a reset operation on pixels in an (i+j+1)-th row among the pixels before ending a reset operation on the pixels in an (i+j)-th row, in a scanning period during which pixel signals are read out from the pixels in the i-th row.

3. The method for driving a solid-state imaging device according to claim 1, wherein the method further comprises, in the following order, (i) in the L-th frame, reading out the pixel signals in the (i+1)-th row, (ii) in the L-th frame, starting the reset operation on the (i+1)-th row, (iii) in the L-th frame, ending the reset operation on the (i+1)-th row, (iv) in the L-th frame, reading out reset signals of the (i+1)-th row, and (v) in the L-th frame, ending the reset operation on the i-th row.

4. The method for driving a solid-state imaging device according to claim 1, wherein the method further comprises, in the following order, (i) in the L-th frame, reading out the pixel signals in the (i+1)-th row, (ii) in the L-th frame, starting the reset operation on the (i+1)-th row, (iii) in the L-th frame, ending the reset operation on the i-th row, and (iv) in the L-th frame, reading out reset signals of the i-th row.

5. The method for driving a solid-state imaging device according to claim 1, wherein the pixels are arranged in a two-dimensional array of m columns in the horizontal scanning direction and 2k rows or (2k+1) rows in the vertical scanning direction, where 2k is equal to n or (2k+1) is equal to n, wherein the method further comprises (i) driving odd-numbered frames including reading out pixel signals sequentially at two-row intervals, from the first row to an (n−1)-th row or the n-th row, and (ii) driving even-numbered frames after the driving of odd-numbered frames, including reading out pixels signals sequentially at two-row intervals, from a second row to the n-th row or the (n−1)-th row, the driving of odd-numbered frames and the driving of even-numbered frames being performed in one frame, wherein the driving of odd-numbered frames includes, in the following order, (i) in the L-th frame, reading out pixel signals in a (2a+1)-th row, (ii) in the L-th frame, resetting the (2a+1)-th row, (iii) in the L-th frame, reading out reset signals of the (2a+1)-th row, and (iv) in the L-th frame, resetting a 2a-th row, where a is an integer no less than 0 and no greater than k, and wherein the driving of even-numbered frames includes, in the following order, (i) in the L-th frame, reading out pixel signals in a (2a+2)-th row, (ii) in the L-th frame, resetting the (2a+2)-th row, (iii) in the L-th frame, reading out reset signals of the (2a+2)-th row, and (iv) in the L-th frame, resetting the (2a+1)-th row.

* * * * *